United States Patent
Hsu

(10) Patent No.: US 10,840,356 B2
(45) Date of Patent: Nov. 17, 2020

(54) FINFET DEVICE AND METHOD OF FORMING SAME

(71) Applicant: Taiwan Semiconductor Manufacturing Company, Ltd., Hsinchu (TW)

(72) Inventor: Yu-Rung Hsu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/390,999

(22) Filed: Apr. 22, 2019

(65) Prior Publication Data

US 2019/0252524 A1 Aug. 15, 2019

Related U.S. Application Data

(62) Division of application No. 15/829,705, filed on Dec. 1, 2017, now Pat. No. 10,269,936.

(Continued)

(51) Int. Cl.
*H01L 29/66* (2006.01)
*H01L 21/3065* (2006.01)
(Continued)

(52) U.S. Cl.
CPC .. *H01L 29/66795* (2013.01); *H01L 21/02057* (2013.01); *H01L 21/02636* (2013.01); *H01L 21/3065* (2013.01); *H01L 21/76224* (2013.01); *H01L 21/823431* (2013.01); *H01L 21/823842* (2013.01); *H01L 21/823857* (2013.01); *H01L 21/823878* (2013.01); *H01L 29/0649* (2013.01); *H01L 29/0847* (2013.01); *H01L 29/66545* (2013.01); *H01L 29/66636* (2013.01);
(Continued)

(58) Field of Classification Search
CPC .......... H01L 29/66795; H01L 29/7848; H01L 29/66545; H01L 29/66636; H01L 21/3065; H01L 21/02636; H01L 29/0847; H01L 29/7851; H01L 29/0649; H01L 21/76224; H01L 21/31053; H01L 21/823878; H01L 21/823828; H01L 21/823821; H01L 21/823814; H01L 29/165; H01L 29/205; H01L 21/0274; H01L 21/266
See application file for complete search history.

(56) References Cited

U.S. PATENT DOCUMENTS

| 7,056,781 B2 * | 6/2006 | Yoon | H01L 21/84 257/E21.703 |
| 8,796,759 B2 | 8/2014 | Perng et al. | |
| 9,812,363 B1 | 11/2017 | Liao et al. | |

* cited by examiner

*Primary Examiner* — David Vu
(74) *Attorney, Agent, or Firm* — Slater Matsil, LLP

(57) ABSTRACT

A method for forming a semiconductor device includes forming a fin over a substrate, forming an isolation region adjacent the fin, forming a dummy gate structure over the fin, recessing the fin adjacent the dummy gate structure to form a first recess using a first etching process, reshaping the first recess to form a reshaped first recess using a second etching process, wherein the second etching process etches upper portions of the fin adjacent the top of the recess more than the second etching process etches lower portions of the fin adjacent the bottom of the recess, and epitaxially growing a source/drain region in the reshaped first recess. Reshaping the first recess includes performing an oxide etch process, wherein the oxide etch process forms a porous material layer within the recess.

20 Claims, 44 Drawing Sheets

Related U.S. Application Data

(60) Provisional application No. 62/552,967, filed on Aug. 31, 2017.

(51) Int. Cl.
    *H01L 21/02*     (2006.01)
    *H01L 29/08*     (2006.01)
    *H01L 29/78*     (2006.01)
    *H01L 29/06*     (2006.01)
    *H01L 21/8238*     (2006.01)
    *H01L 21/762*     (2006.01)
    *H01L 21/8234*     (2006.01)
    *H01L 21/027*     (2006.01)
    *H01L 21/3105*     (2006.01)
    *H01L 29/165*     (2006.01)
    *H01L 29/205*     (2006.01)
    *H01L 21/266*     (2006.01)

(52) U.S. Cl.
    CPC ...... *H01L 29/7848* (2013.01); *H01L 29/7851* (2013.01); *H01L 21/0274* (2013.01); *H01L 21/266* (2013.01); *H01L 21/31053* (2013.01); *H01L 21/823814* (2013.01); *H01L 21/823821* (2013.01); *H01L 21/823828* (2013.01); *H01L 29/165* (2013.01); *H01L 29/205* (2013.01)

FINFET DEVICE AND METHOD OF FORMING SAME

PRIORITY CLAIM AND CROSS-REFERENCE

This application is a divisional of U.S. patent application Ser. No. 15/829,705, filed on Dec. 1, 2017, entitled "FinFET Device and Method of Forming Same", which is a conversion of U.S. Provisional Application No. 62/552,967, "FinFET Device and Method of Forming Same" filed on Aug. 31, 2017, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
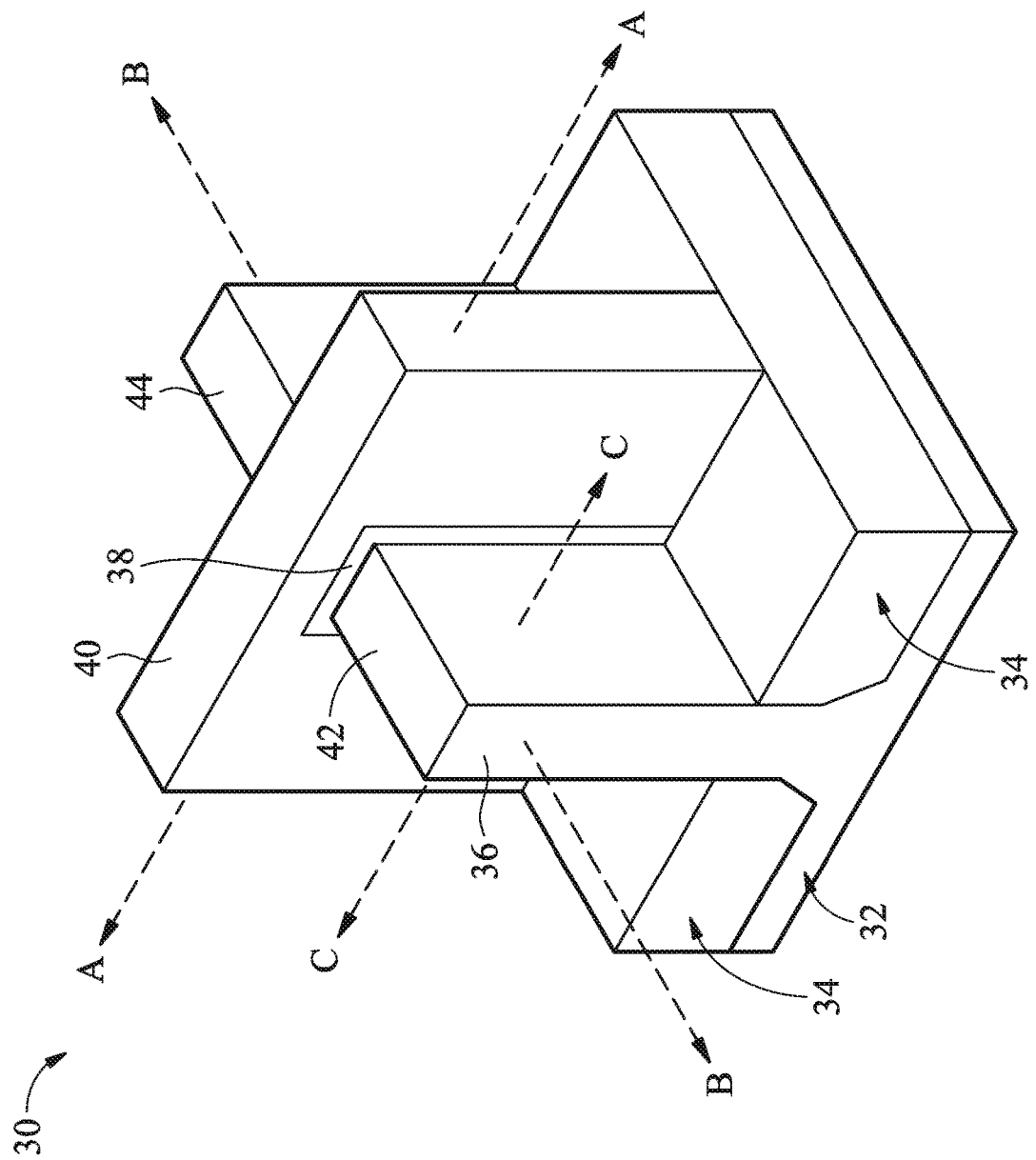
FIG. 1 is a perspective view of a fin field-effect transistor ("FinFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a FinFET device and a method of forming the same. Various embodiments discussed herein allow for controlling the shape of a channel region of a FinFET device, such that the top of the channel region is reduced in size more than the middle of the channel region is reduced in size or more than a height of the channel region is increased. By controlling the shape of the channel region of a FinFET in this manner, the performance of the FinFET device may be improved. Various embodiments presented herein are discussed in the context of FinFETs formed using a gate-last process. In other embodiments, a gate-first process may be used. Some embodiments contemplate aspects used in planar devices, such as planar FETs. Some embodiments may be used in a device such as a ring oscillator, or may be used in other types of devices. Some embodiments may also be used in semiconductor devices other than FETs.

FIG. 1 illustrates an example of a fin field-effect transistor (FinFET) 30 in a three-dimensional view. The FinFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in subsequent figures. Cross-section A-A is across a channel, gate dielectric 38, and gate electrode 40 of the FinFET 30. Cross-section C-C is in a plane that is parallel to cross-section A-A and is across fin 36 outside of the channel. Cross-section B-B is perpendicular to cross-section A-A and is along a longitudinal axis of the fin 36 and in a direction of, for example, a current flow between the source/drain regions 42 and 44. Subsequent figures refer to these reference cross-sections for clarity.

FIGS. 2A through 17C are cross-sectional views of intermediate stages in the manufacturing of FinFETs in accordance with some embodiment. In FIGS. 2A through 9A-C and FIGS. 11A-C through 17A-C, figures ending with an "A" designation are illustrated along the reference cross-section A-A illustrated in FIG. 1, except for multiple FinFETs and multiple fins per FinFET. Figures ending with a "B" designation are illustrated along the reference cross-section B-B illustrated in FIG. 1. Figures ending with a "C" designation are illustrated along the cross-section C-C illustrated in FIG. 1. FIGS. 10A-F are all illustrated along the reference cross-section B-B illustrated in FIG. 1.

Figure 2A:
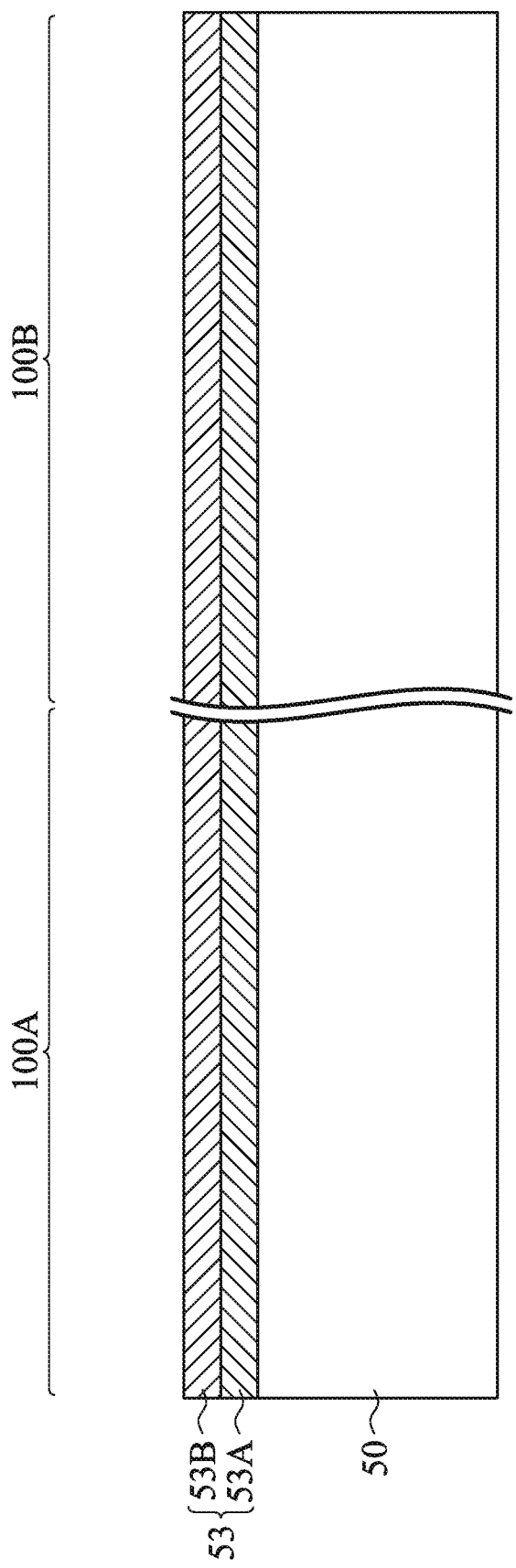
FIG. 2A is a cross-sectional view of an intermediate stage in the manufacture of a FinFET device in accordance with some embodiments.

FIG. 2A illustrates a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 may further include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the resulting FinFETs. The integrated circuit devices may be formed using any suitable methods.

In some embodiments, the substrate 50 may comprise a first region 100A and a second region 100B. The first region 100A can be for forming n-type devices, such as NMOS transistors, such as n-type FinFETs. The second region 100B can be for forming p-type devices, such as PMOS transistors, such as p-type FinFETs. Accordingly, the first region 100A may be also referred to as an NMOS region 100A, and the second region 100B may be also referred to as a PMOS region 100B. In some embodiments, the first region 100A may be physically separated from the second region 100B. The first region 100A may be separated from the second region 100B by any number of features.

FIG. 2A further illustrates the formation of a mask 53 over the substrate 50. In some embodiments, the mask 53 may be used in a subsequent etching step to pattern the substrate 50 (See FIG. 3A). As shown in FIG. 2A, the mask 53 may include a first mask layer 53A and a second mask layer 53B. The first mask layer 53A may be a hard mask layer, may comprise silicon nitride, silicon oxynitride, silicon carbide, silicon carbonitride, a combination thereof, or the like, and may be formed using any suitable process, such as atomic layer deposition (ALD), physical vapor deposition (PVD), chemical vapor deposition (CVD), a combination thereof, or the like. The first mask layer 53A may also include multiple layers, and the multiple layers may be different materials. For example, the first mask layer 53A may include a layer of silicon nitride over a layer of silicon oxide, though other materials and combinations of materials may also be used. The second mask layer 53B may comprise photoresist, and in some embodiments, may be used to pattern the first mask layer 53A for use in the subsequent etching step discussed above. The second mask layer 53B may be formed by using a spin-on technique and may be patterned using acceptable photolithography techniques. In some embodiments, the mask 53 may comprise three or more mask layers.

Figure 3A:
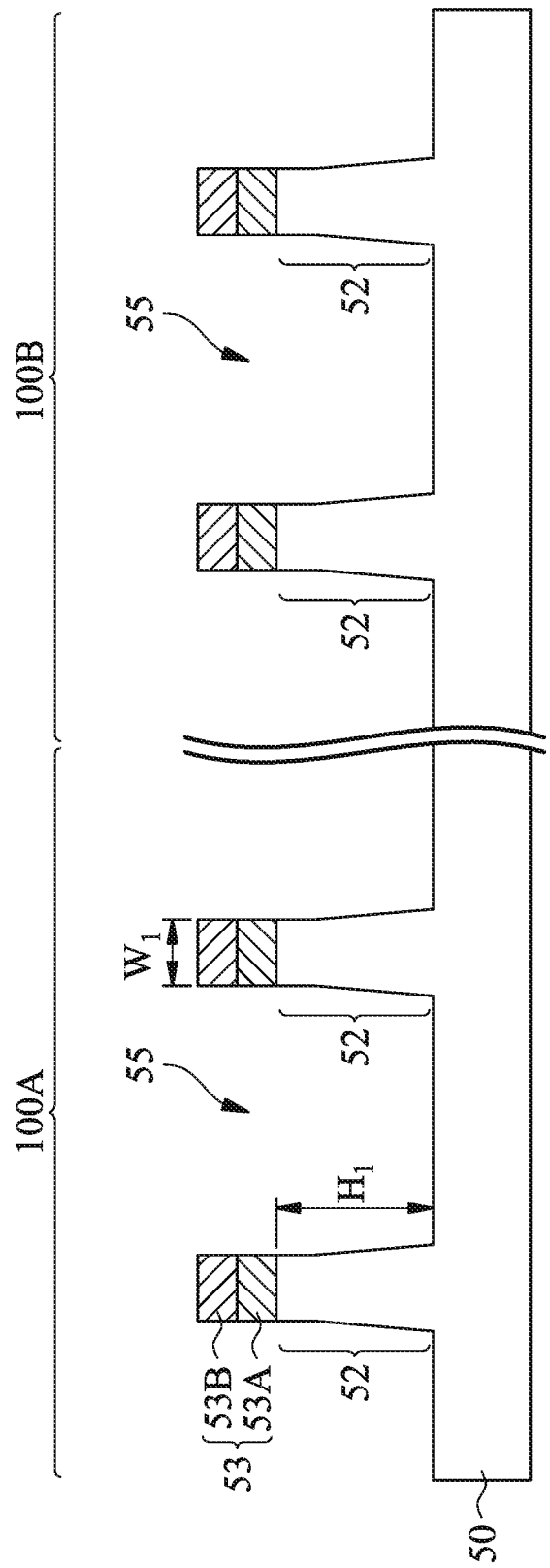
FIG. 3A is a cross-sectional view of an intermediate stage in the manufacture of a FinFET device in accordance with some embodiments.

FIG. 3A illustrates the formation of semiconductor strips 52 in the substrate 50. First, mask layers 53A and 53B may be patterned, where openings in mask layers 53A and 53B expose areas 55 of the substrate 50 where Shallow Trench Isolation (STI) regions 54 will be formed. Next, an etching process may be performed, where the etching process creates the trenches 55 in the substrate 50 through the openings in the mask 53. The remaining portions of the substrate 50 underlying a patterned mask 53 form a plurality of semiconductor strips 52. The etching may be any acceptable etch process, such as a reactive ion etch (RIE), neutral beam etch (NBE), the like, or a combination thereof. The etch process may be anisotropic. In some embodiments, the semiconductor strips 52 may have a height $H_1$ between about 200 nm and about 400 nm, and may have a width $W_1$ between about 10 nm and about 40 nm.

The semiconductor strips 52 may be patterned by any suitable method. For example, the semiconductor strips 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over substrate 50 and patterned using a photolithography process. Spacers may be formed alongside the patterned sacrificial layer using a self-aligned process. The sacrificial layer is then removed, and the remaining spacers, or mandrels, may then be used as a mask to pattern the semiconductor strips 52.

Figure 4A:
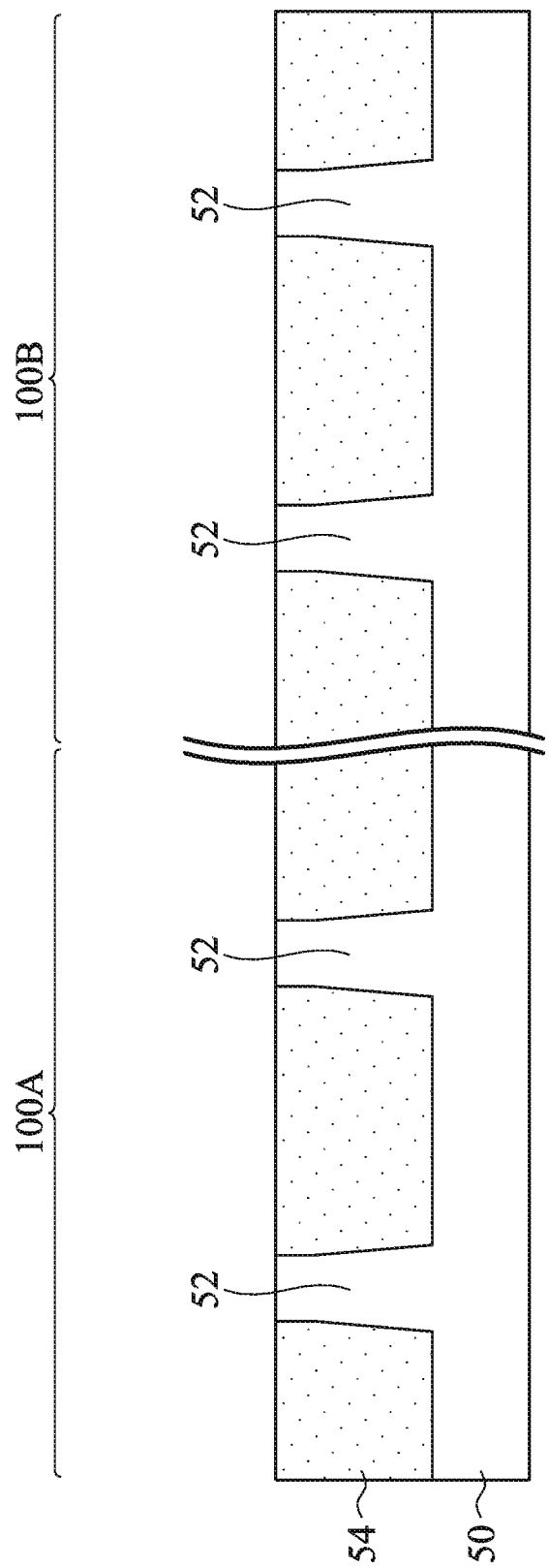
FIG. 4A is a cross-sectional view of an intermediate stage in the manufacture of a FinFET device in accordance with some embodiments.

FIG. 4A illustrates the formation of an insulation material in the trenches 55 (see FIG. 3A) between neighboring semiconductor strips 52 to form isolation regions 54. The insulation material may be an oxide, such as silicon oxide, a nitride, such as silicon nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable processes may be also used.

Furthermore, in some embodiments, the isolation regions 54 may include a conformal liner (not illustrated) formed on sidewalls and a bottom surface of the trenches 55 (see FIG. 3A) prior to the filling of the trenches 55 with an insulation material of the isolation regions 54. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, or the like. The formation of the liner may include any suitable method, such as ALD, CVD, HDP-CVD, PVD, a combination thereof, or the like. In such embodiments, the liner may prevent (or at least reduce) the diffusion of the semiconductor material from the semiconductor strips 52 (e.g., Si and/or Ge) into the surrounding isolation regions 54 during the subsequent annealing of the isolation regions 54. For example, after the insulation material of the isolation regions 54 are deposited, an annealing process may be performed on the insulation material of the isolation regions 54.

Referring further to FIG. 4A, a planarization process, such as a chemical mechanical polishing (CMP), may remove any excess insulation material of the isolation regions 54, such that top surfaces of the isolation regions 54 and top surfaces of the semiconductor strips 52 are coplanar. In some embodiments, the CMP may also remove the mask 53. In other embodiments, the mask 53 may be removed using a wet etching process separate from the CMP.

Figure 5A:
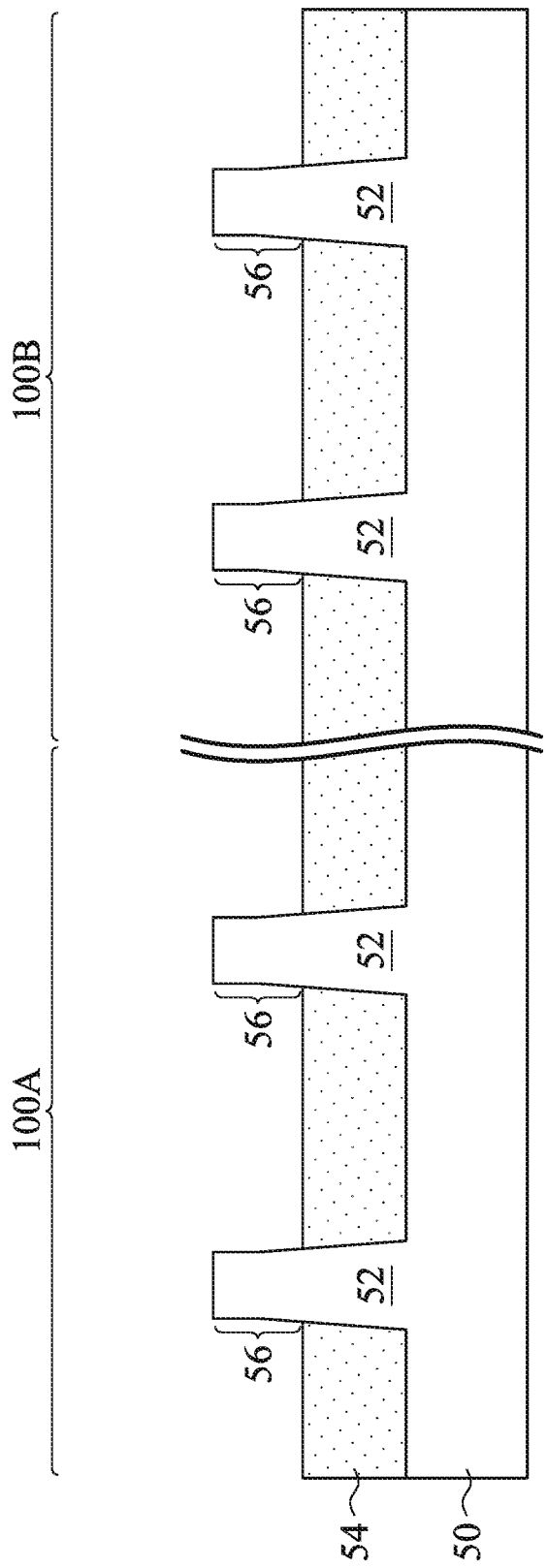
FIG. 5A is a cross-sectional view of an intermediate stage in the manufacture of a FinFET device in accordance with some embodiments.

FIG. 5A illustrates the recessing of the isolation regions 54 to form fins 56. The isolation regions 54 are recessed such that fins 56 in the first region 100A and in the second region 100B protrude from between neighboring isolation regions 54. In some embodiments, the semiconductor strips 52 may be considered to be part of the fins 56. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate process. The isolation regions 54 may be recessed using an acceptable etching process, such as one that is selective to the material of the isolation regions 54. For example, a STI oxide removal using a CERTAS® etch, an Applied Materials SICONI or R2 tool, or dilute hydrofluoric (dHF) acid may be used.

A person having ordinary skill in the art will readily understand that the process described with respect to FIGS. 2A through 5A is just one example of how the fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In yet other embodiments, heteroepitaxial structures can be used for the fins. For example, the semiconductor strips 52 in FIG. 4A can be recessed, and a material different from the semiconductor strips 52 may be epitaxially grown in their place. In even further embodiments, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth. In other embodiments, homoepitaxial or heteroepitaxial structures may be doped using, for example, ion implantation after homoepitaxial or heteroepitaxial structures are epitaxially grown. Still further, it may be advantageous to epitaxially grow a material in the NMOS region 100A different from the material in the PMOS region 100B. In various embodiments, the fins 56 may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6A:
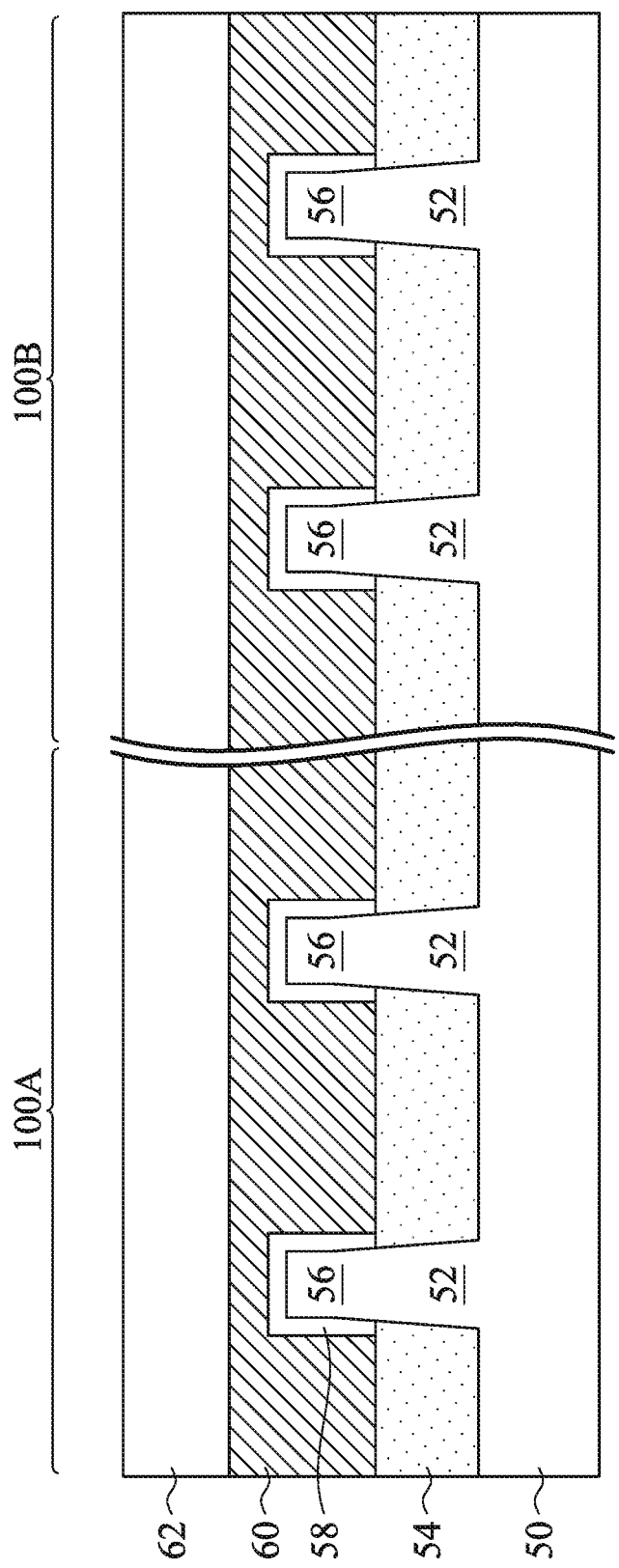
FIGS. 6A-6B are cross-sectional views of intermediate stages in the manufacture of a FinFET device in accordance with some embodiments.
Figure 6B:
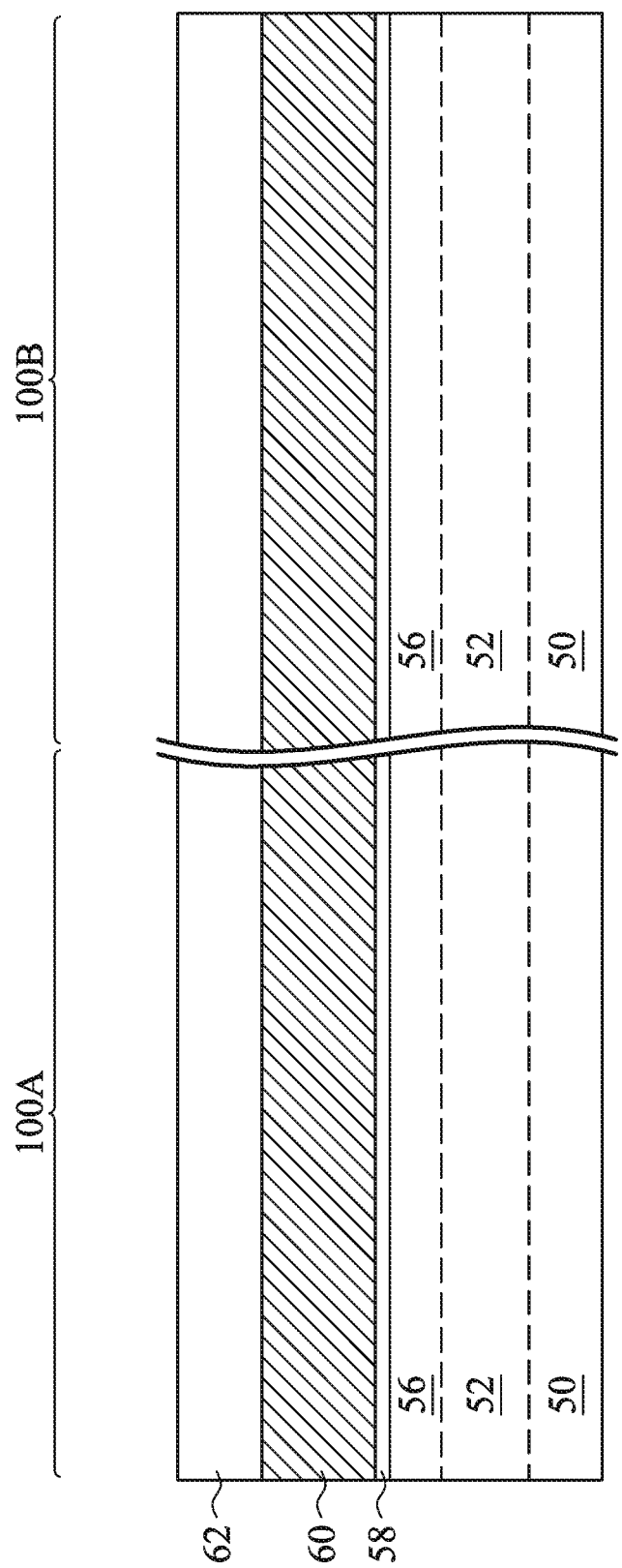

In FIGS. 6A and 6B, a dummy dielectric layer 58 is formed on the fins 56. The dummy dielectric layer 58 may be, for example, silicon oxide, silicon nitride, a combination thereof, or the like, and may be deposited (using, for example, CVD, PVD, a combination thereof, or the like) or thermally grown (for example, using thermal oxidation, or the like) according to acceptable techniques. A dummy gate layer 60 is formed over the dummy dielectric layer 58, and a mask 62 is formed over the dummy gate layer 60. In some embodiments, the dummy gate layer 60 may be deposited over the dummy dielectric layer 58 and then planarized using, for example, a CMP process. The mask 62 may be deposited over the dummy gate layer 60. The dummy gate layer 60 may be made of, for example, polysilicon, although other materials that have a high etching selectivity with respect to the material of the isolation regions 54 may also be used. The mask 62 may include one or more layers of, for example, silicon nitride, silicon oxynitride, silicon carbide, silicon carbonitride, the like, or a combination thereof.

Referring further to FIGS. 6A and 6B, in the illustrated embodiment, a single dummy dielectric layer 58, a single dummy gate layer 60, and a single mask 62 are formed across the first region 100A and the second region 100B. In other embodiments, separate dummy dielectric layers, separate dummy gate layers, and separate masks may be formed in the first region 100A and the second region 100B. In some embodiments, the dummy dielectric layer 58 may have a thickness between about 0.8 nm and about 2.0 nm, and the dummy gate layer 60 may have a thickness between about 50 nm and about 100 nm.

Figure 7A:
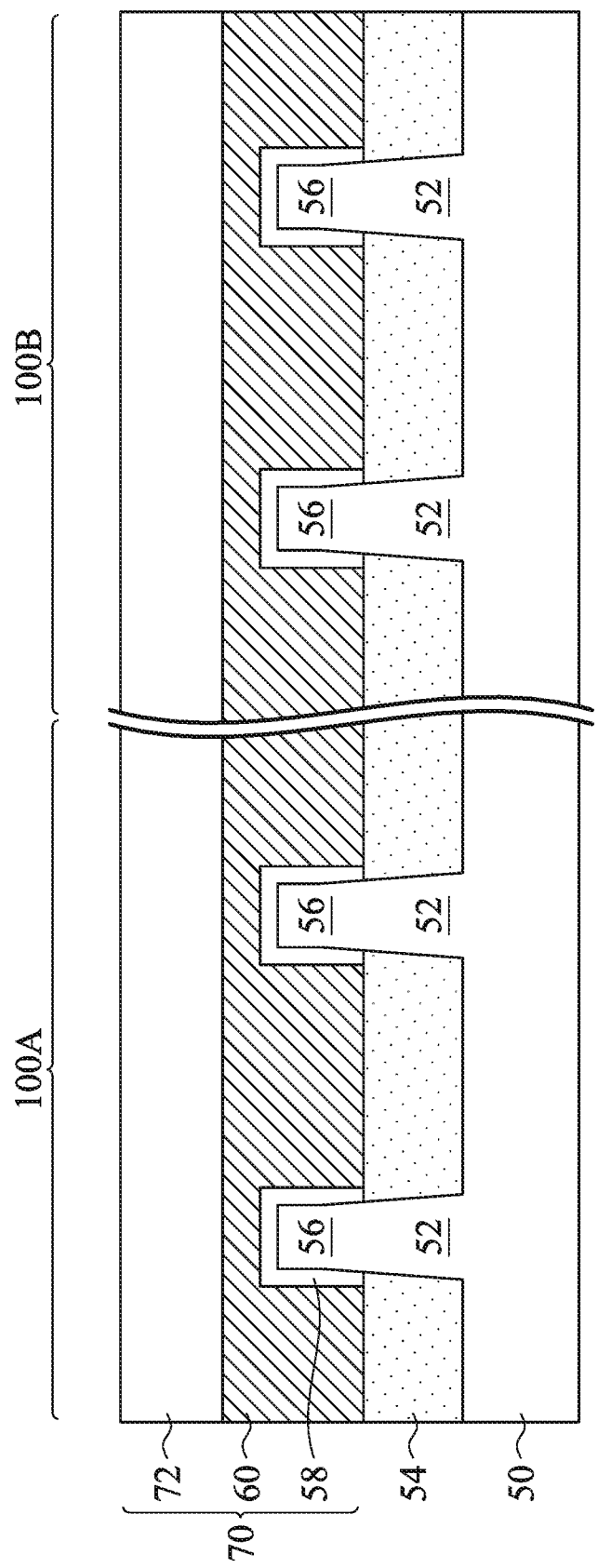
FIGS. 7A-7C are cross-sectional views of intermediate stages in the manufacture of a FinFET device in accordance with some embodiments.
Figure 7B:
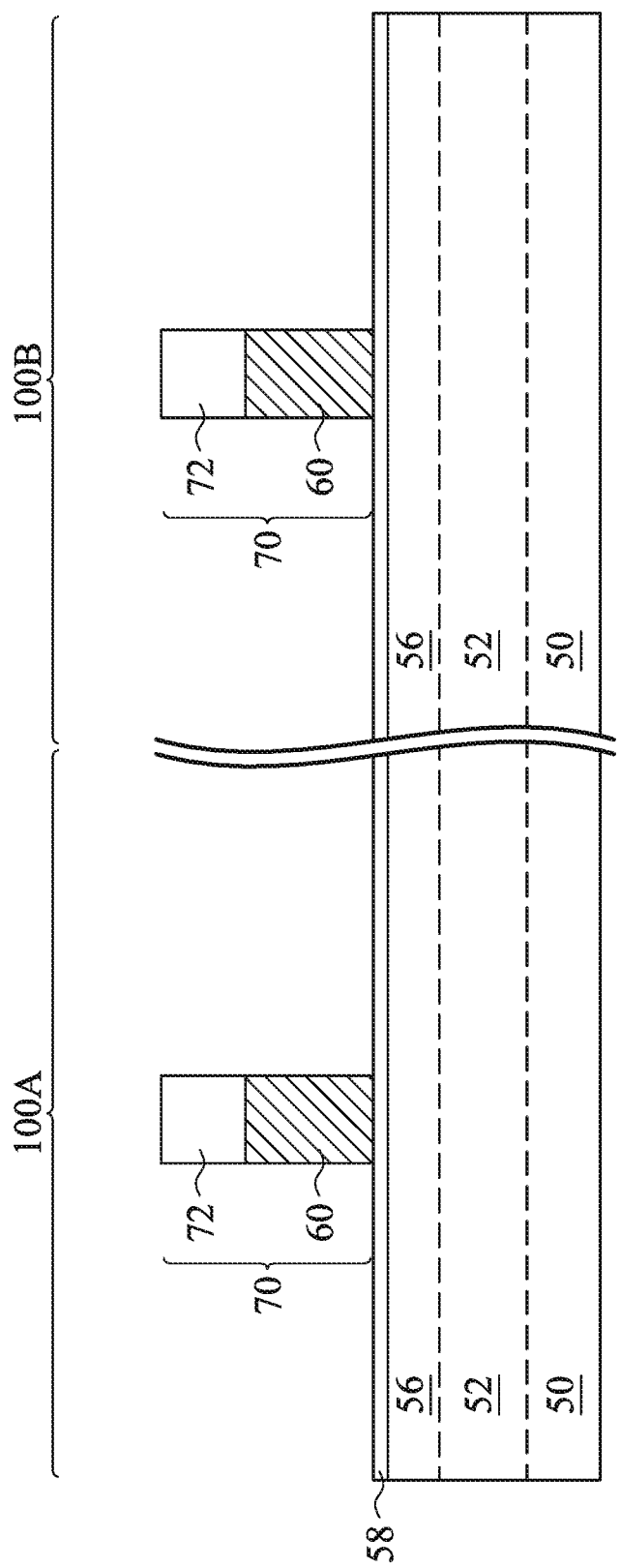
Figure 7C:
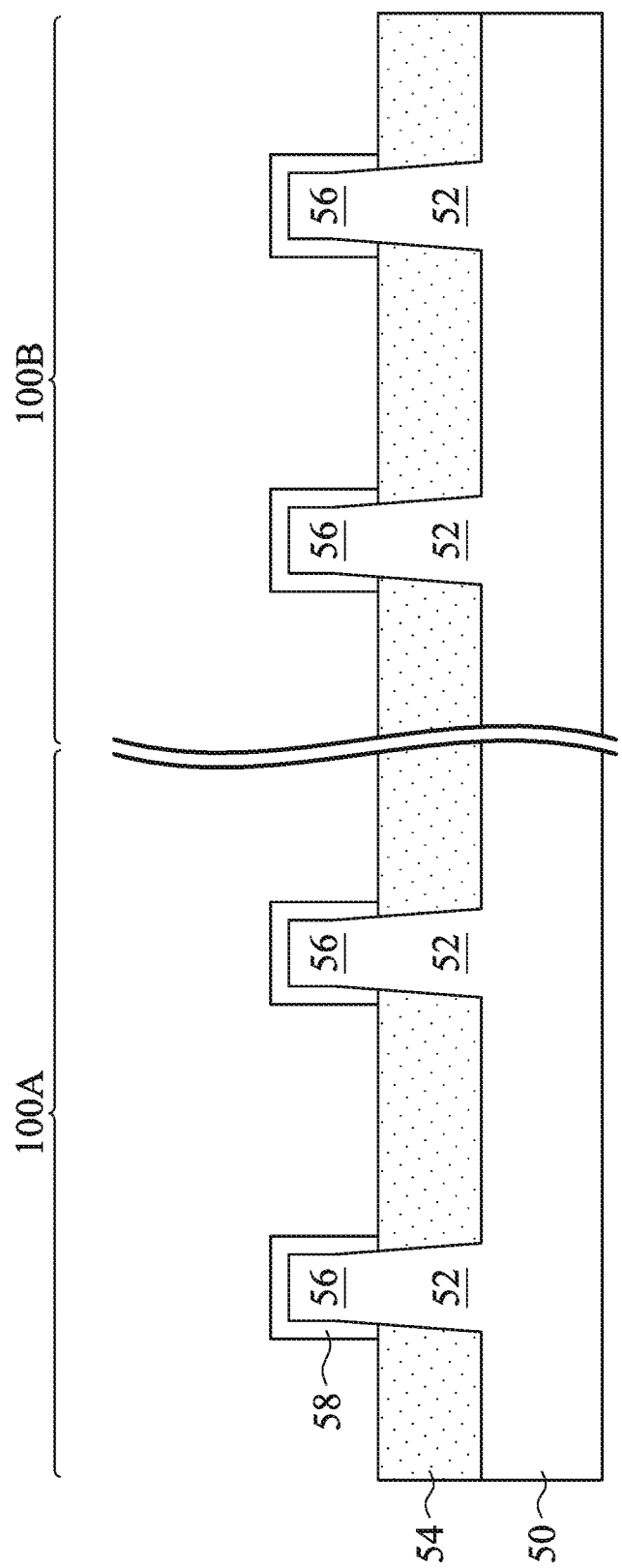

In FIGS. 7A, 7B, and 7C, the mask 62 (see FIGS. 6A and 6B) may be patterned using acceptable photolithography and etching techniques to form a mask 72 in the first region 100A and in the second region 100B. The mask 72 may be a hardmask, and the pattern of the mask 72 may be different between the first region 100A and the second region 100B The pattern of the mask 72 may be transferred to the dummy gate layer 60 by an acceptable etching technique to form dummy gate stack 70 in the first region 100A and in the second region 100B. The dummy gate stack 70 includes the dummy gate layer 60 and the mask 72. In some embodiments, the dummy gate layer 60 and the mask 72 are formed in separate processes in the first region 100A and the second region 100B, and may be formed of different materials in the first region 100A and the second region 100B. Optionally, the pattern of the mask 72 may similarly be transferred to dummy dielectric layer 58. The pattern of the dummy gate stack 70 covers respective channel regions of the fins 56 while exposing source/drain regions of the fins 56. The dummy gate stack 70 may also have a lengthwise direction substantially perpendicular to the lengthwise direction of respective fins 56. A size of the dummy gate stack 70 or a pitch between dummy gate stacks 70 may depend on a region of a die in which the dummy gates are formed. In some embodiments, dummy gate stacks 70 may have a larger size or a larger pitch when located in an input/output region of a die (e.g., where input/output circuitry is disposed) than when located in a logic region of a die (e.g., where logic circuitry is disposed). In some embodiments, the dummy gate stacks 70 may have a width between about 15 nm and about 40 nm.

Referring further to FIGS. 7A, 7B and 7C, appropriate wells (not shown) may be formed in the fins 56, the semiconductor strips 52, and/or the substrate 50. For example, a P-well may be formed in the first region 100A, and an N-well may be formed in the second region 100B. The different implant steps for the different regions 100A and 100B may be achieved using a photoresist or other masks (not shown). For example, a photoresist is formed over the fins 56 and the isolation regions 54 in the first region 100A and the second region 100B. The photoresist is patterned to expose the second region 100B of the substrate 50, such as a PMOS region, while protecting the first region 100A, such as an NMOS region. The photoresist can be formed by using a spin-on technique and can be patterned using acceptable photolithography techniques. Once the photoresist is patterned, n-type impurities are implanted in the second region 100B, and the photoresist may act as a mask to substantially prevent n-type impurities from being implanted into the first region 100A. The n-type impurities may be phosphorus, arsenic, or the like, and may be implanted in the second region 100B to a concentration of equal to or less than $10^{18}$ cm$^{-3}$, such as in a range from about $10^{17}$ cm$^{-3}$ to about $10^{18}$ cm$^{-3}$. After the implantation process, the photoresist is removed using, for example, an acceptable ashing process followed by a wet cleaning process.

Following the implanting of the second region 100B, a second photoresist (not shown) is formed over the fins 56 and the isolation regions 54 in the first region 100A and the second region 100B. The second photoresist is patterned to expose the first region 100A of the substrate 50, while protecting the second region 100B. The second photoresist can be formed by using a spin-on technique and can be patterned using acceptable photolithography techniques. Once the second photoresist is patterned, p-type impurities are implanted in the first region 100A, and the second photoresist may act as a mask to substantially prevent p-type impurities from being implanted into the second region 100B. The p-type impurities may be boron, BF$_2$, or the like, and may be implanted in the first region 100A to a concentration of equal to or less than $10^{18}$ cm$^{-3}$, such as in a range from about $10^{17}$ cm$^{-3}$ to about $10^{18}$ cm$^{-3}$. After the implantation process, the second photoresist is removed using, for example, an acceptable ashing process followed by a wet cleaning process.

After implanting appropriate impurities in first region 100A and the second region 100B, an anneal may be performed to activate the p-type and n-type impurities that were implanted. The implantation process may form a P-well in the first region 100A, and an N-well in the second region 100B. In some embodiments where the fins are epitaxial grown, the grown materials of the fins 56 may be in situ doped during the growth process.

Figure 8A:
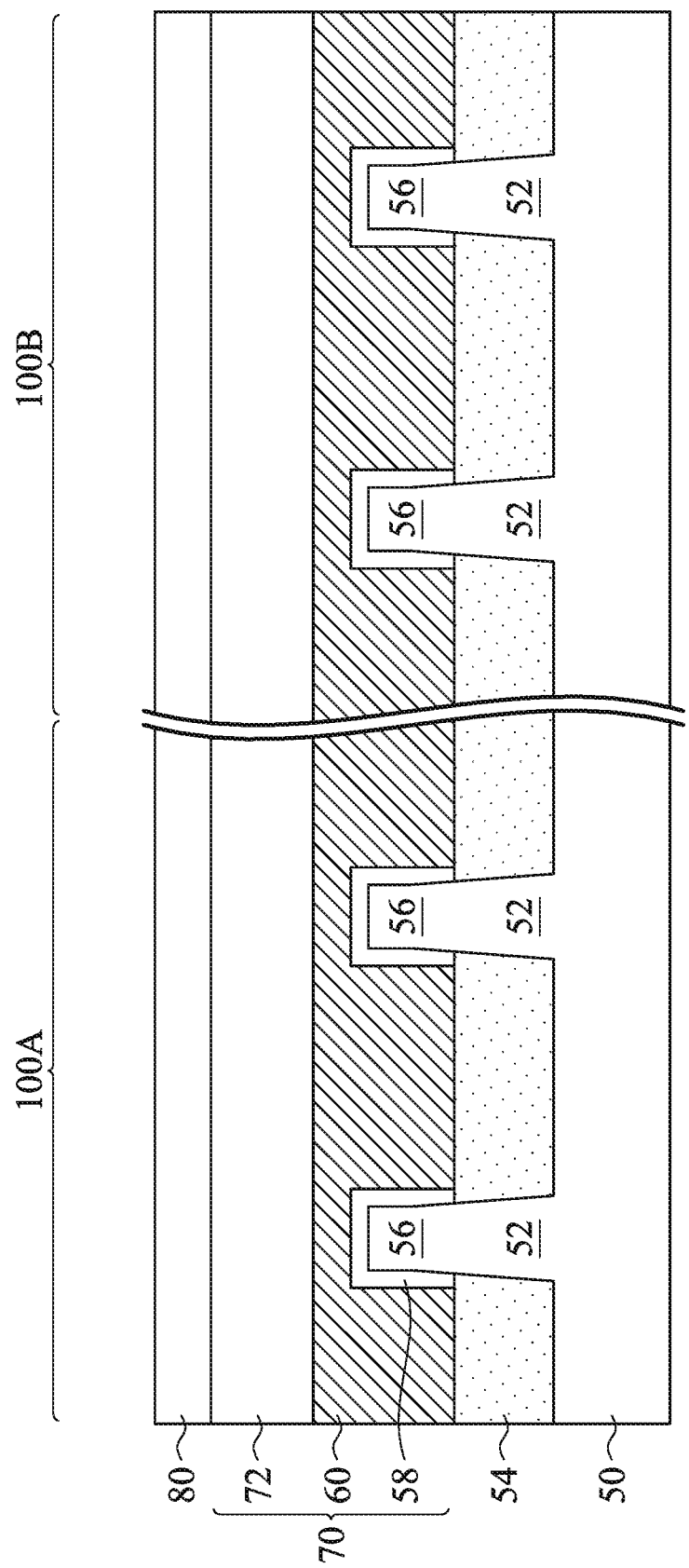
FIGS. 8A-8C are cross-sectional views of intermediate stages in the manufacture of a FinFET device in accordance with some embodiments.
Figure 8B:
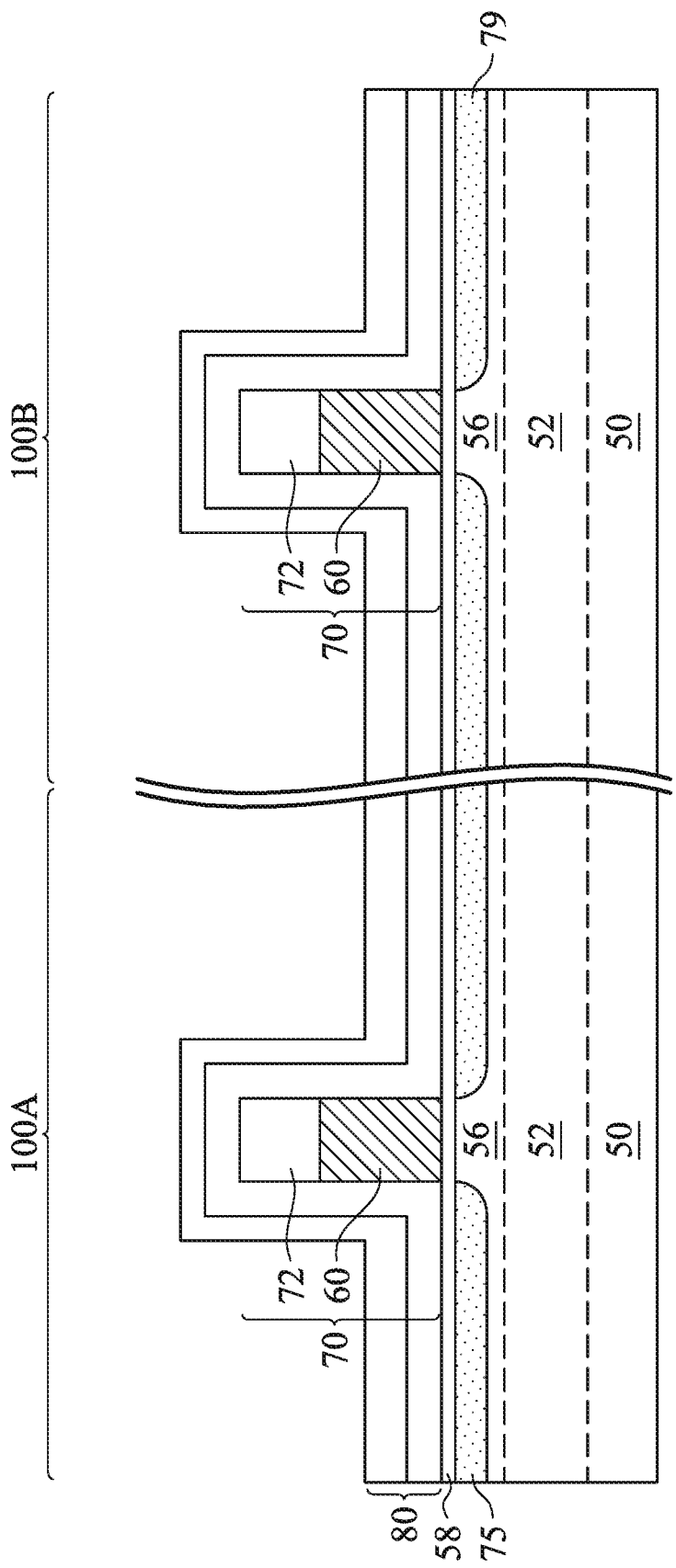
Figure 8C:
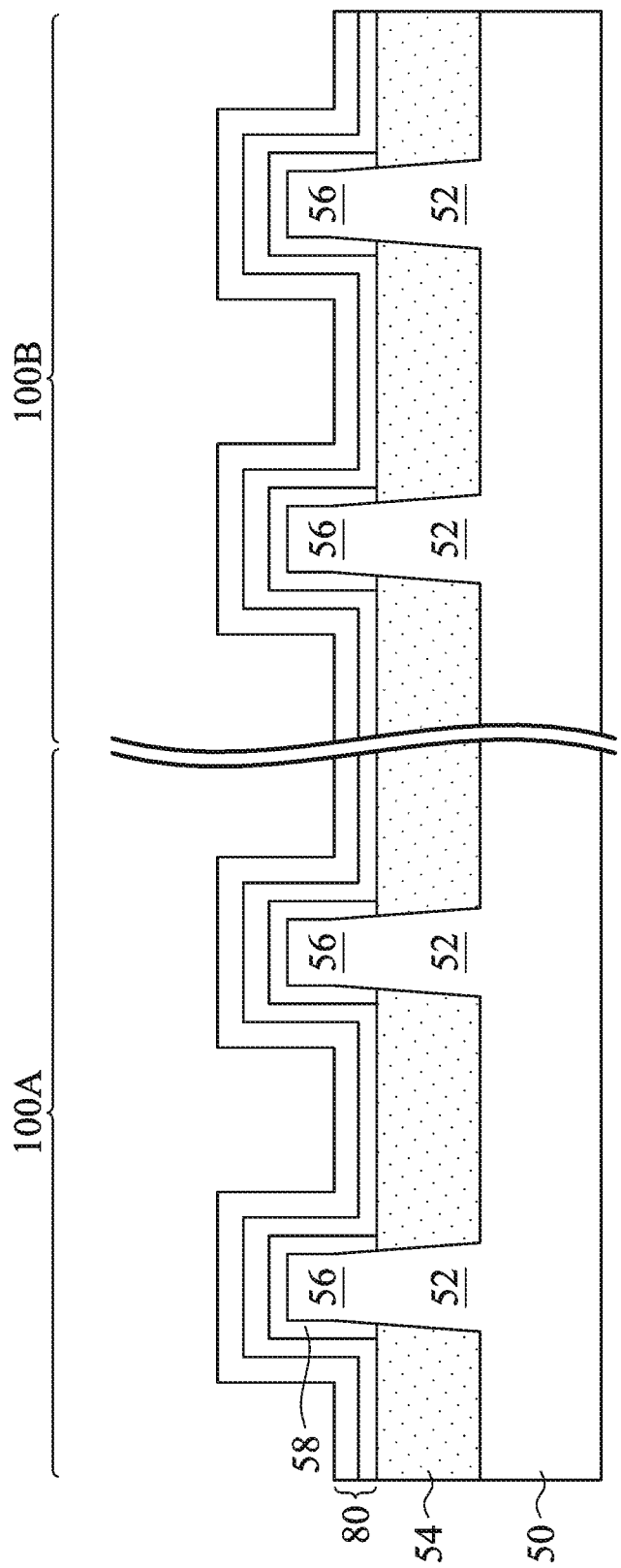

In FIGS. 8A, 8B, and 8C, a gate spacer layer 80 is formed on exposed surfaces of the dummy gate stacks 70 (see FIGS. 8A and 8B) and/or the dummy dielectric layer 58 over the fins 56 (see FIG. 8C). Any suitable methods of forming the gate spacer layer 80 may be used. In some embodiments, a deposition (such as CVD, ALD, or the like) may be used form the gate spacer layer 80. In some embodiments, the gate spacer layer 80 may include one or more layers of, for example, silicon nitride (SiN), silicon oxynitride, silicon carbonitride, silicon oxycarbonitride (SiOCN), a combination thereof, or the like.

Referring further to FIGS. 8A, 8B, and 8C, lightly doped source/drain (LDD) regions 75 and 79 may be formed in the substrate 50 in the first region 100A and the second region 100B, respectively. Similar to the implantation process discussed above with reference to FIGS. 7A, 7B and 7C, a mask (not shown), such as a photoresist, may be formed over the first region 100A, e.g., the NMOS region, while exposing the second region 100B, e.g., the PMOS region, and p-type impurities may be implanted into the exposed fins 56 in the second region 100B to create LDD regions 79. During the implantation of the LDD regions 79, the dummy gate 70 may act as a mask to prevent (or at least reduce) dopants from implanting into a channel region of the exposed fins 56. Thus, the LDD regions 79 may be formed substantially in source/drain regions of the exposed fins 56. The mask may then be removed. Subsequently, a second mask (not shown), such as a photoresist, may be formed over the second region 100B, while exposing the first region 100A, and n-type impurities may be implanted into the exposed fins 56 in the first region 100A to create LDD regions 75. During the implantation of the LDD regions 75, the dummy gate stack 70 may act as a mask to prevent (or at least reduce) dopants from implanting into a channel region of the exposed fins 56. Thus, the LDD regions 75 may be formed substantially in source/drain regions of the exposed fins 56. The second mask may then be removed. The n-type impurities may be any of the n-type impurities previously discussed, and the p-type impurities may be any of the p-type impurities previously discussed. The LDD regions 75 and 79 may each have a concentration of impurities from about $10^{15}$ cm$^{-3}$ to about $10^{16}$ cm$^{-3}$. An annealing process may be performed to activate the implanted impurities.

Figure 9A:
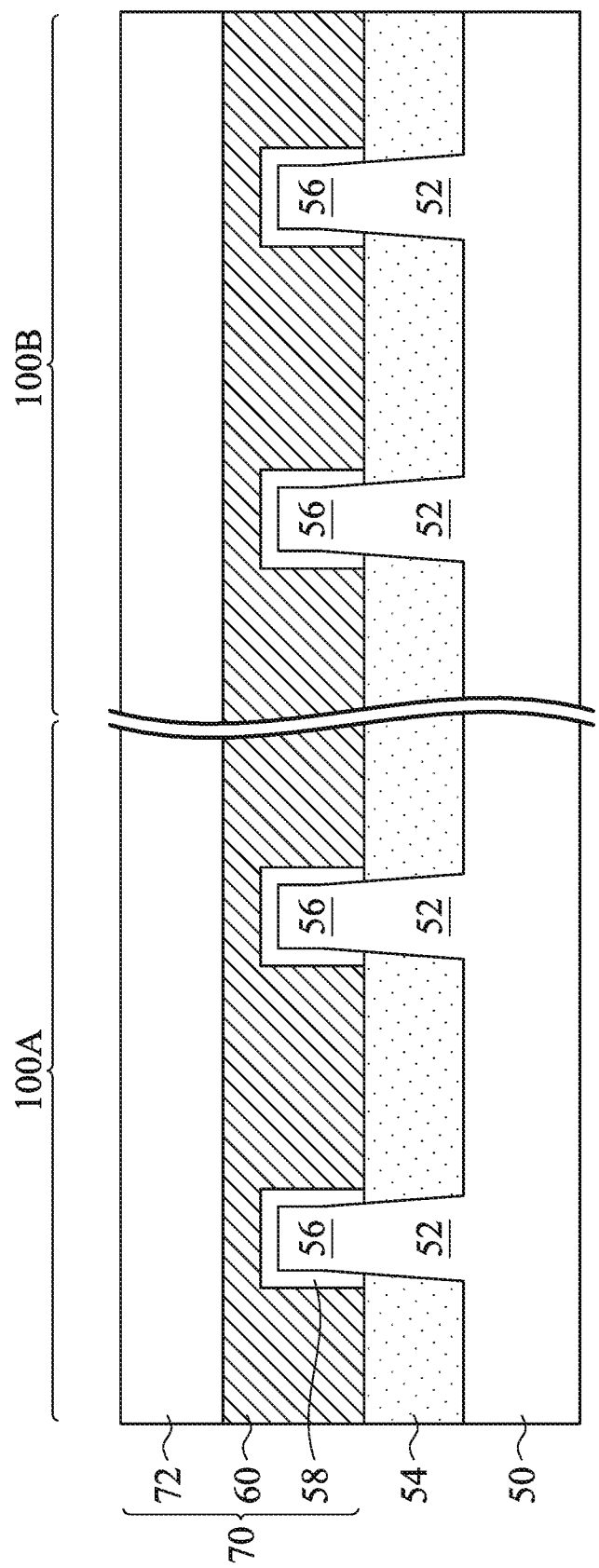
FIGS. 9A-9C are cross-sectional views of intermediate stages in the manufacture of a FinFET device in accordance with some embodiments.
Figure 9B:
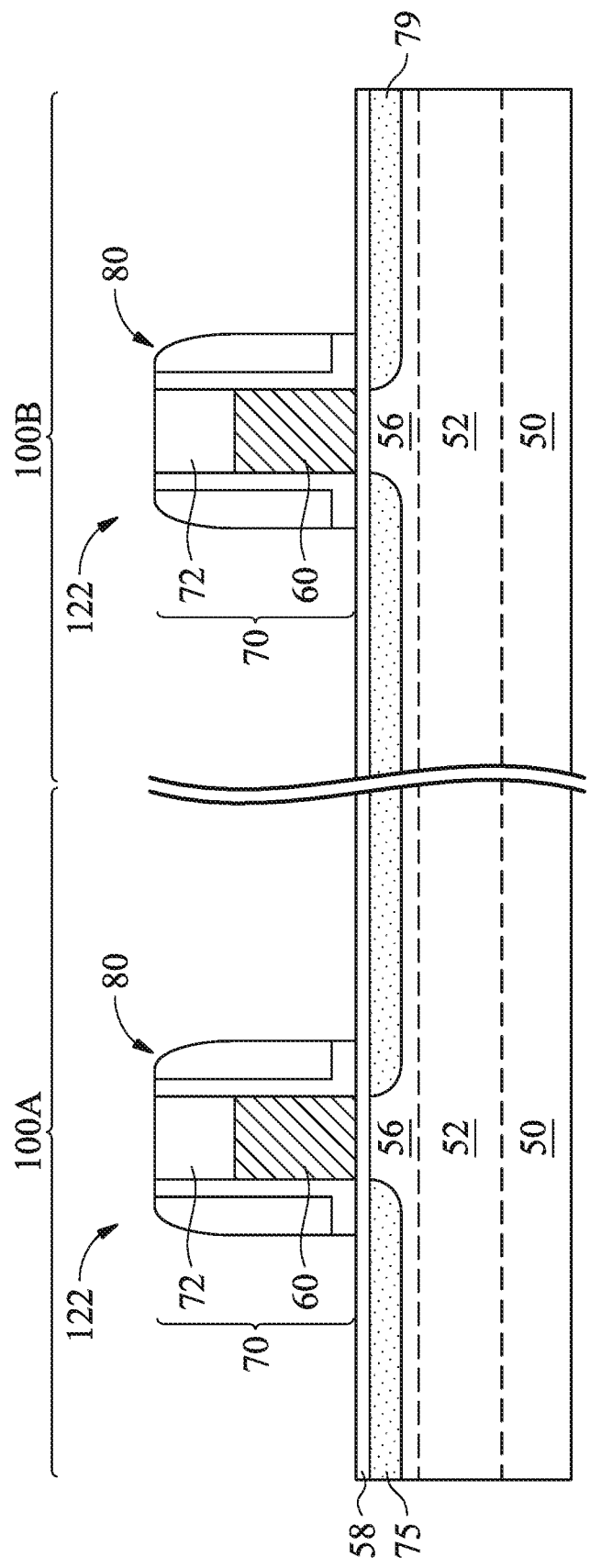
Figure 9C:
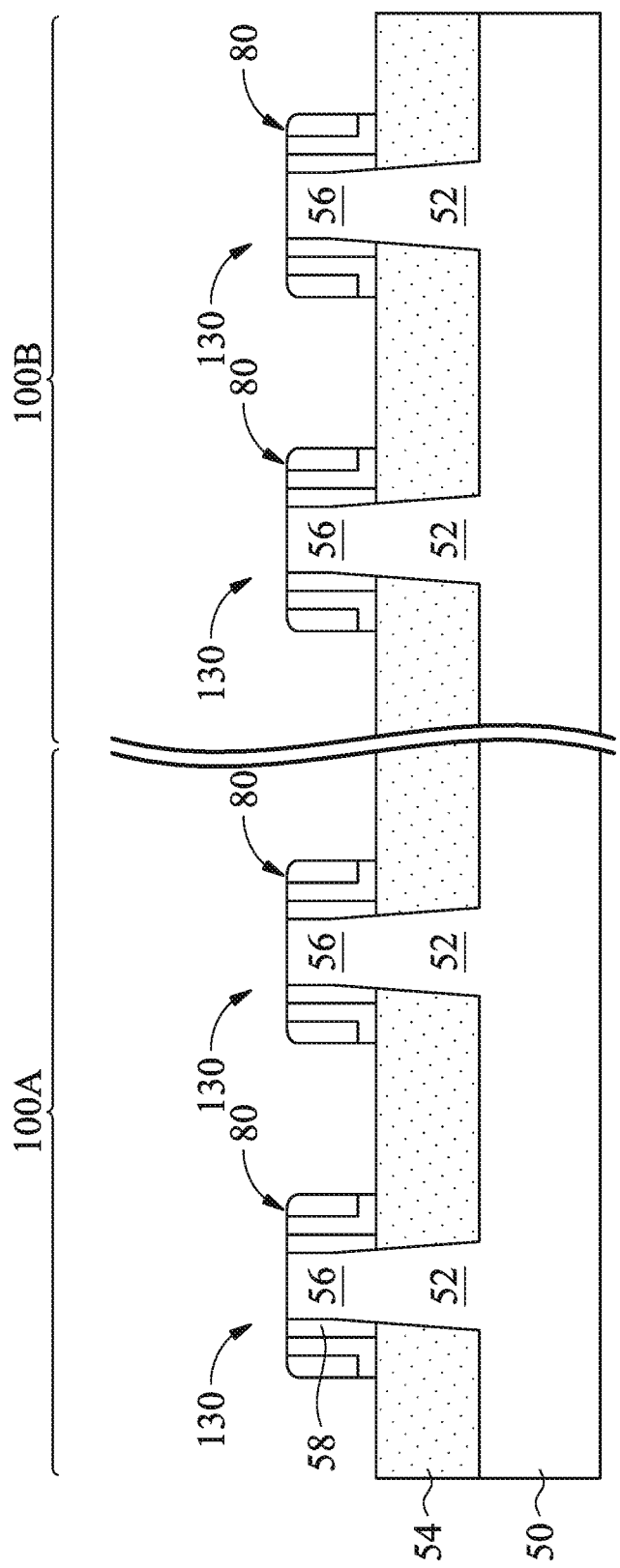

Referring to FIGS. 9A, 9B, and 9C, an etching process is performed on portions of the gate spacer layer 80. The etching process may be anisotropic. After preforming the etching process, lateral portions of the spacer layer over the LDD regions 75 and over the isolation regions 54 may be removed to expose top surfaces of the fins 56 and the masks 72 for the dummy gate stack 70. Portions of the spacer layer 80 along sidewalls of the dummy gate stack 70 may remain to form gate spacers 122 and along sidewalls of the fins 56 may remain to form fin spacers 130. In other embodiments, the spacer layer 80 may also be removed from the sidewalls of the fins 56. In some embodiments, the spacer layer 80 in the second region 100B is also patterned to form gate spacers 122 and fin spacers 130 along sidewalls of the dummy gates 70 and the fins 56. In some embodiments, gate spacers 122 and fin spacers 130 are formed at the same time in first region 100A and second region 100B, and in other embodiments, gate spacers 122 and fin spacers 130 are formed in a separate process in first region 100A and second region 100B.

FIGS. 10A through 12C illustrate the formation of epitaxial source/drain regions 82 and 84 in the first region 100A and the second region 100B. In some embodiments, the epitaxial source/drain regions 82 (see FIGS. 12B and 12C) in the first region 100A may be formed before the epitaxial source/drain regions 84 (see FIGS. 12B and 12C) are formed in the second region 100B. In other embodiments, the epitaxial source/drain regions 84 in the second region 100B may be formed before forming the epitaxial source/drain regions 82 in first region 100A.

Figure 10A:
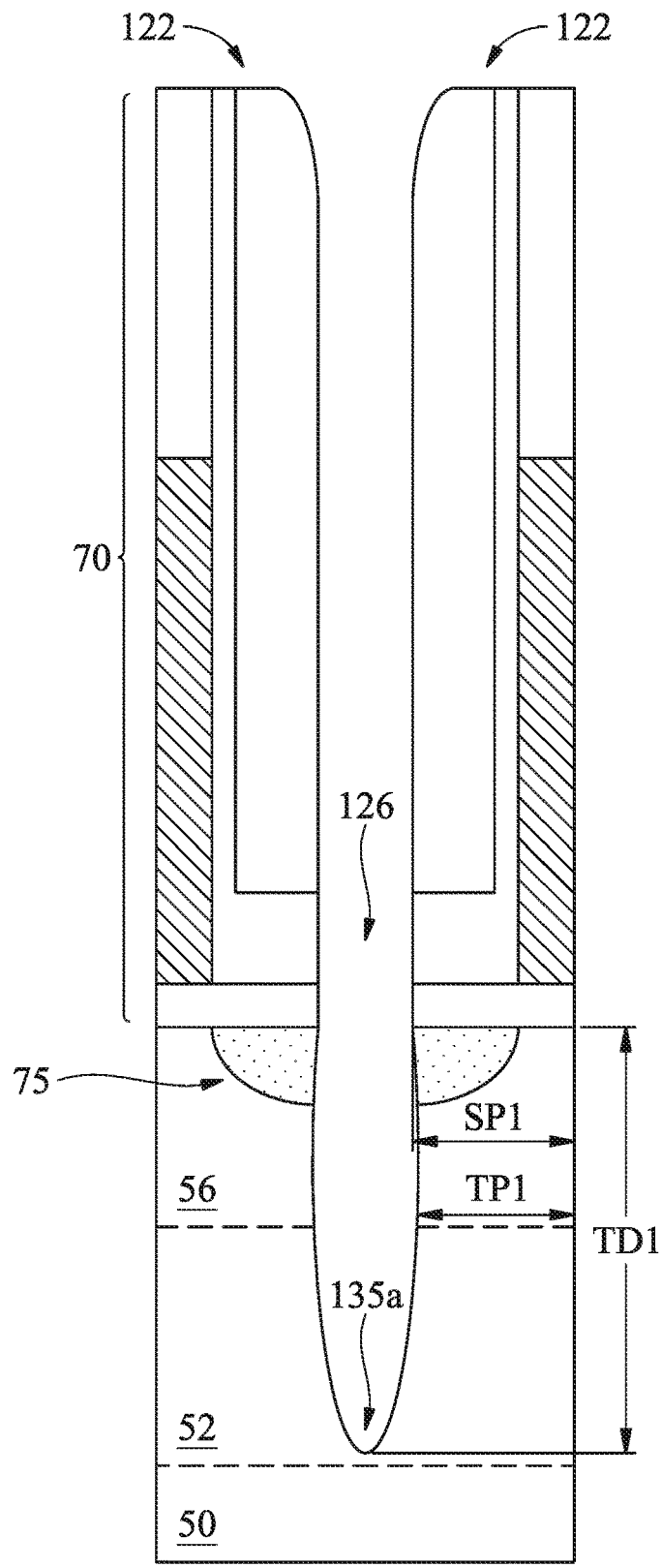
FIGS. 10A-10F are cross-sectional views of recess etching in the manufacture of a FinFET device in accordance with some embodiments.

FIGS. 10A through 12C illustrate the formation of the epitaxial source/drain regions 82 in the first region 100A between neighboring fins 56. FIGS. 10A-10F are all illustrated along the reference cross-section B-B illustrated in FIG. 1. During the formation of the epitaxial source/drain regions 82 in first region 100A, e.g., the NMOS region, the second region 100B, e.g., the PMOS region may be masked (not shown). Referring first to FIG. 10A, a patterning process is performed on the fins 56 to form recesses 126 in source/drain regions of the fins 56. The first patterning process may be performed in a manner that the recesses 126 are formed between neighboring dummy gate stacks 70 (in interior regions of the fins 56), or between an isolation region 54 and adjacent dummy gate stacks 70 (in end regions of the fins 56) as shown in the cross-section illustrated later in FIG. 11B. In some embodiments, the patterning process may include a suitable anisotropic dry etching process, while using the dummy gate stacks 70, the gate spacers 122, the fin spacers 130 and/or isolation regions 54 as a combined mask. The suitable anisotropic dry etching process may include a reactive ion etch (RIE), neutral beam etch (NBE), the like, or a combination thereof. In some embodiments where the RIE is used in the first patterning process, process parameters such as, for example, a process gas mixture, a voltage bias, and an RF power may be chosen such that etching is predominantly performed using physical etching, such as ion bombardment, rather than chemical etching, such as radical etching through chemical reactions. In some embodiments, a voltage bias may be increased to increase energy of ions used in the ion bombardment process and, thus, increase a rate of physical etching. Since, the physical etching in anisotropic in nature and the chemical etching is isotropic in nature, such an etching process has an etch rate in the vertical direction that is greater than an etch rate in the lateral direction. In some embodiments, the anisotropic etching process may be performed using a process gas mixture including $CH_3F$, $CH_4$, HBr, $O_2$, Ar, a combination thereof, or the like. In some embodiments, the first patterning process forms recesses 126 having U-shaped bottom surfaces 135a. The recesses 126 may also be referred to as U-shaped recesses 126, an example recess 126 of which is shown in FIG. 10A. FIG. 10A also shows the recess 126 has a surface proximity $SP_1$, measured laterally from the middle of the dummy gate 60 to the top of the recess 126, and a tip proximity $TP_1$, measured laterally from the middle of the dummy gate 60 to the edge of the recess 126 at half of the depth of the recess 126. In some embodiments, the recess 126 has a trench depth $TD_1$, as measured from a top surface of the fins 56, between about 40 nm and about 70 nm, such as about 53 nm. In some embodiments, the etching process for forming the U-shaped recesses 126 may also etch isolation regions, which is illustrated later in FIGS. 11C-17C by dashed lines.

Figure 10B:
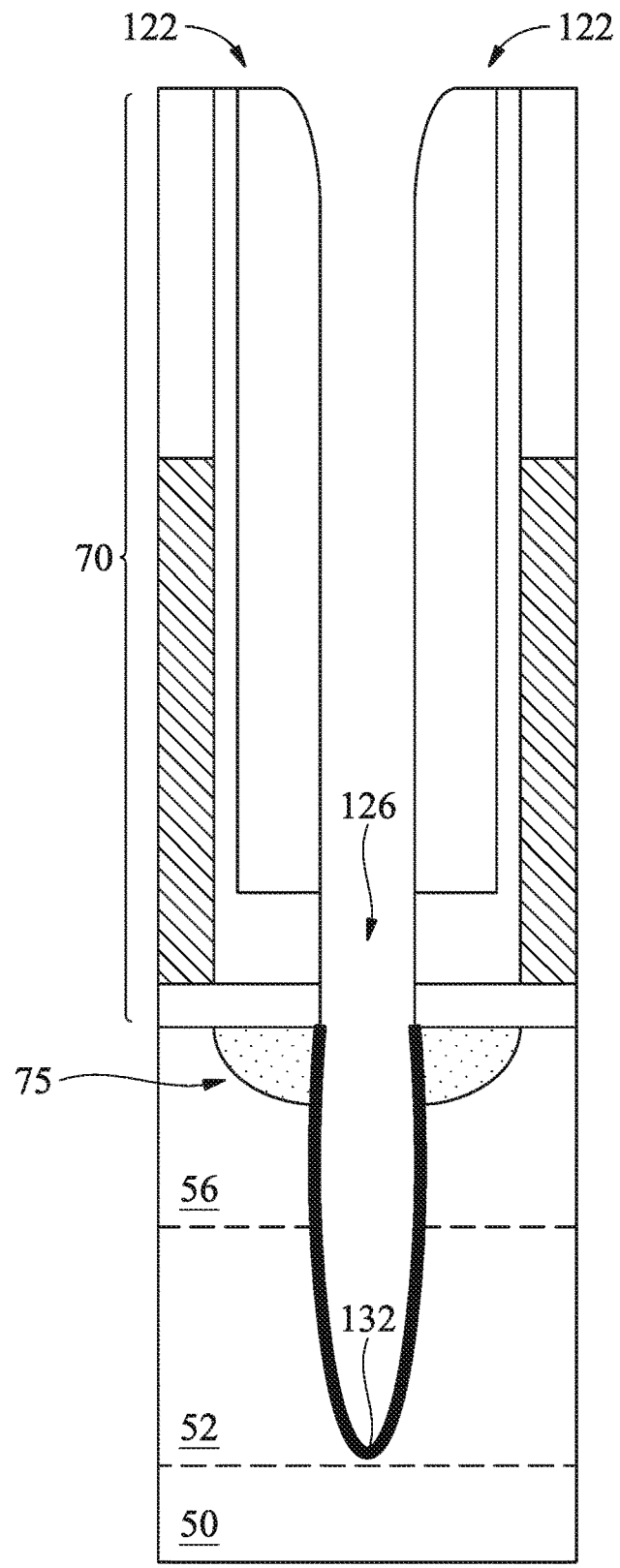

FIG. 10B illustrates the recess 126 after a native oxide 132 has formed on surface of the recess 126 after the patterning process described in FIG. 10A. The native oxide may, for example, be a silicon oxide for an embodiment in which the substrate 50 (and the semiconductor strips 52 and the fins 56) are silicon. In some cases, the native oxide 132 may have a thickness between about 0.6 nm and about 1.8 nm, such as about 1.5 nm. In some cases, the native oxide 132 forms once the substrate 50 is removed from a chamber (e.g., a vacuum) in which the patterning process is performed.

In some embodiments, the native oxide 132 is removed using a surface modification process, which in some embodiments may be a dry etch such as an RIE process. The surface modification process may use a combination of $NF_3$ and $NH_3$ as process gases. Other gases may additionally be used in the surface modification process, such as He or Ar. During the surface modification process, the $NF_3$ and $NH_3$ gases react with the silicon oxide 132 to form water and solid ammonium fluorosilicate (AFS), $(NH_4)_2SiF_x$. The reaction can be expressed as:

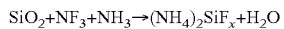

$$SiO_2 + NF_3 + NH_3 \rightarrow (NH_4)_2SiF_x + H_2O$$

Figure 10C:
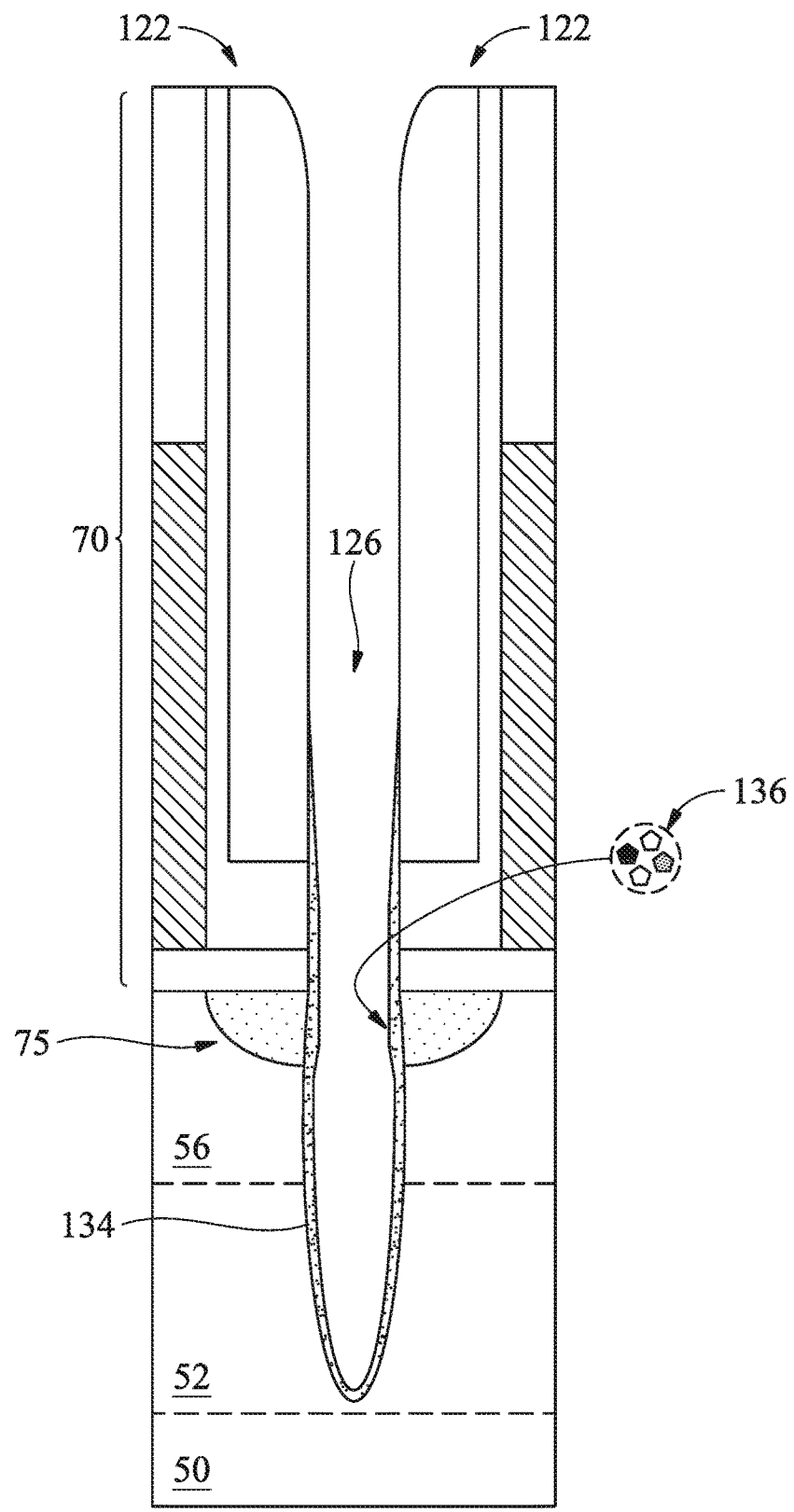

As shown in FIG. 10C, the AFS 134 is a solid phase byproduct that, when formed during the surface modification process, can cover the surface of the recess 126. In some cases, the AFS 134 may also be present on portions of gate spacers 122, as shown in FIG. 10C. The thickness and extent of the AFS 134 may be controlled by controlling the process conditions of the surface modification process, such as energy, temperature, pressure, amount or flow rate of the process gases, or other conditions. In some cases, the thickness of the AFS 134 formed is between about 4-8 times the initial thickness of the native oxide 132. In some cases, the thickness of the AFS 134 material formed on the recess 126 is between about 4 nm and about 8 nm, though in other cases the AFS 134 may have a different thickness.

In some cases, the AFS 134 can form as a porous material. This porosity allows the AFS 134 to absorb process gases, radicals, reaction byproducts, etchants, and other materials present during the surface modification process. The materials that can be absorbed by the AFS 134 are shown collectively in FIG. 10C as initial etchants 136. The initial etchants 136 may be absorbed throughout the AFS 134. The initial etchants 136 may, for example, include $NH_3$, $NF_3$, $H_2O$, radicals such as HF* or F*, or other substances. The amounts, concentrations, or types of the initial etchants 136 can be controlled by controlling the characteristics of the surface modification process. Example characteristics include process gas flow rate, pressure, the ratio of the process gases, or other characteristics. As discussed below, the absorbed initial etchants 136 can enable additional etching of the recess 126.

Figure 10D:
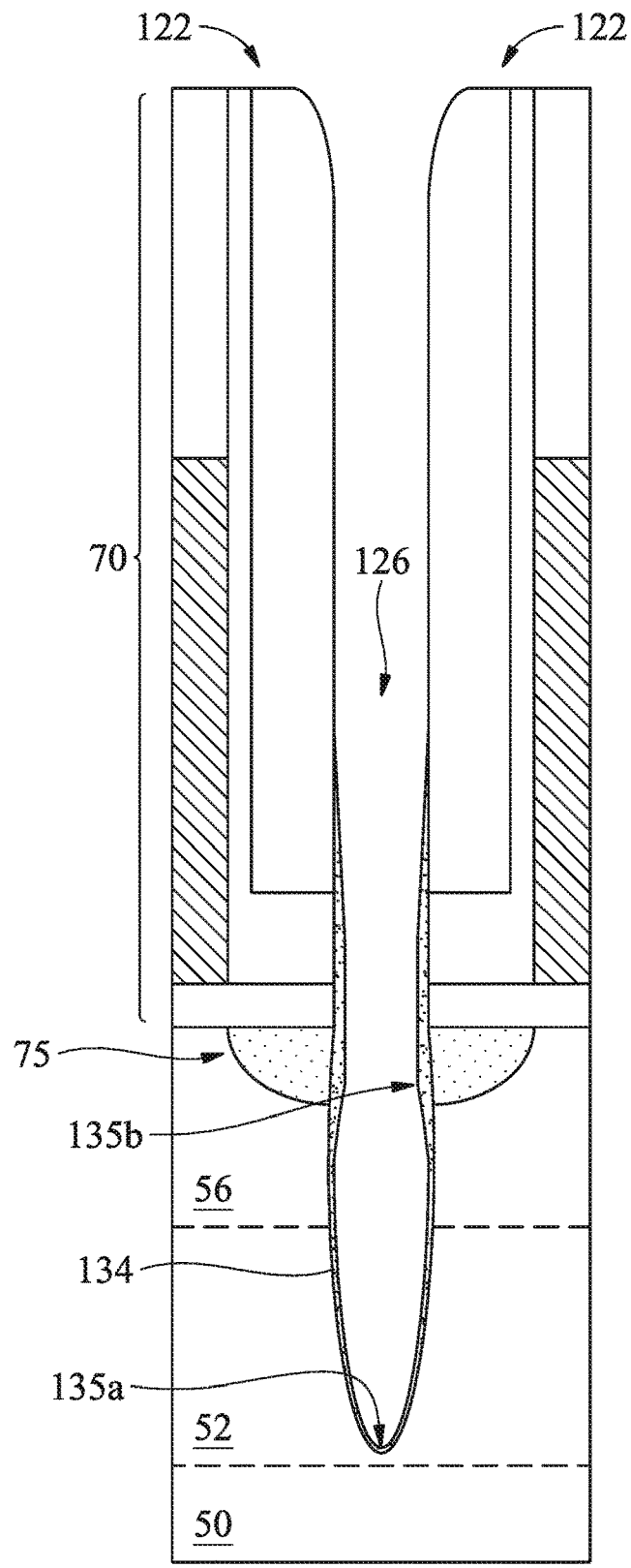

FIG. 10D illustrates the recess 126 after an initial pumping stage has been performed to remove portions of the AFS 134. During the initial pumping stage, portions of AFS 134 are pumped out of the recess 126. However, due to the shape and depth of the recess 126, during pumping the flow near the bottom surface 135a of the recess 126 is greater than the flow near vertical sidewalls of the recess, such as near the top surface 135b of the recess 126. Thus, AFS 134 near the bottom surface 135a is pumped out of the recess 126 more efficiently than AFS 134 near the top surface 135b of the recess. Due to the differences in pumping efficiency, the initial pumping stage may remove more of the AFS 134 present near the bottom surface 135a of the recess 126 than the AFS 134 present near the top surface 135b of the recess 126. In some cases, the initial pumping stage removes almost all of the AFS 134 present near the bottom surface 135a. In some embodiments, the AFS 134 remaining near the top surface 135b may have a thickness between about 4 nm and about 8 nm, though the AFS 134 near the top surface 135b may have another thickness in other cases. In some embodiments, the AFS 134 remaining near the bottom surface 135a may have a thickness less than about 0.1 nm, though the AFS 134 near the bottom surface 135a may have another thickness in other cases. In some cases, during the initial pumping stage some of the AFS 134 removed near the bottom surface 135a redeposits near the top surface 135b. As a result, the AFS 134 near the top surface 135b may be thicker than the AFS 134 near the bottom surface 135a.

In some embodiments, the amount and distribution of AFS 134 remaining after the initial pumping stage can be controlled by controlling the conditions of the initial pumping stage. Example initial pumping stage conditions that can be controlled include pressure, duration, and temperature. In some embodiments, the process pressure during the initial pumping stage may be between about 100 mTorr and about 700 mTorr. In some embodiments, the temperature during the initial pumping stage may be higher than about 75° C., such as about 90° C.

Figure 10E:
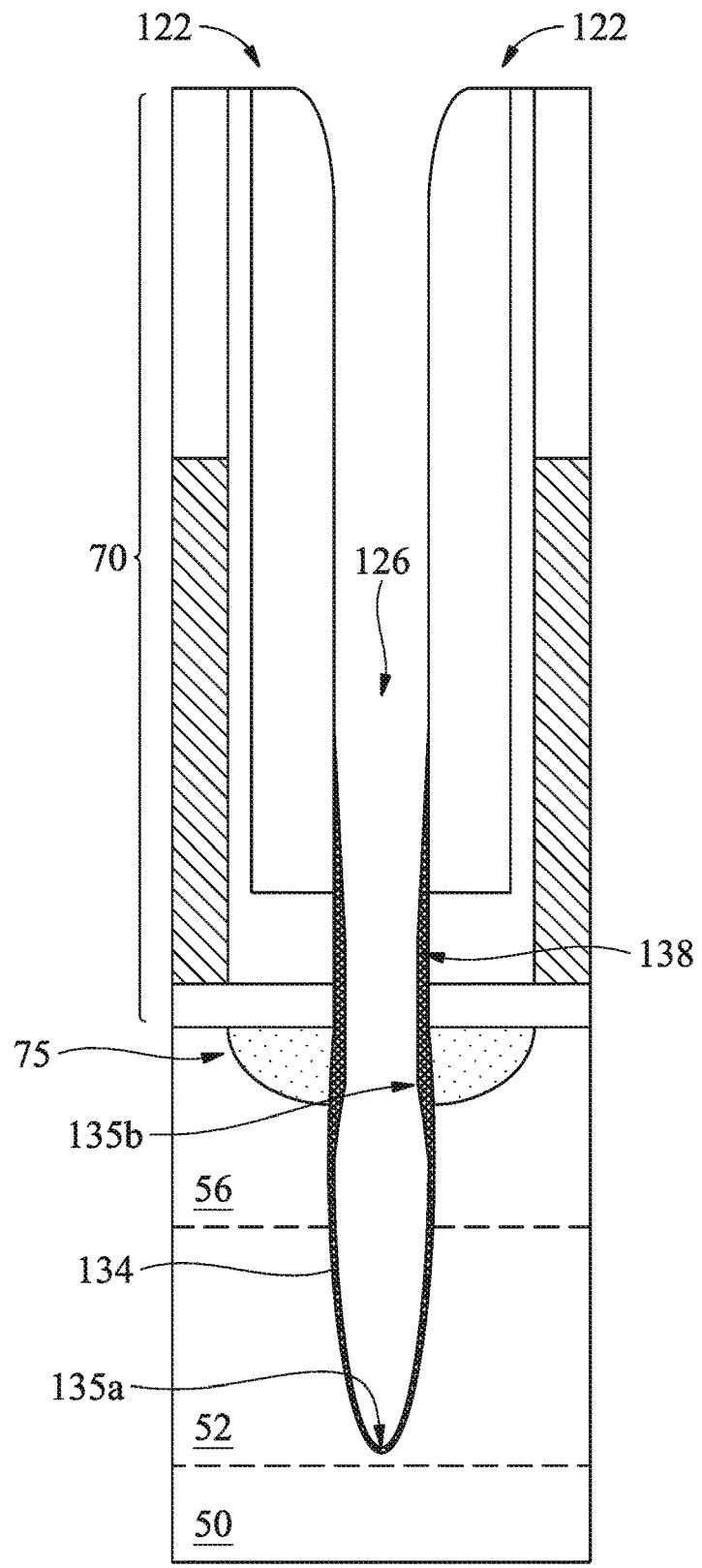

As described above with respect to FIG. 10C, some initial etchants 136 from the surface modification process are absorbed within the AFS 134. Some of the initial etchants 136 absorbed within the AFS 134 can react with byproducts also absorbed within the AFS 134 to further etch the sides of the recess 126. FIG. 10E illustrates the AFS 134 as containing secondary etchants 138 formed from absorbed initial etchants 136, though secondary etchants 138 may form from absorbed initial etchants 136 at any point during or after the surface modification process. Secondary etchants 138 that diffuse through the AFS 134 to the surface of the recess 126 are able to additionally etch the surface material. For example, the secondary etchants 138 may additionally etch material of the substrate 50, semiconductor strips 52, or fins 56 present at the surface of the recess 126. Because the thickest regions of remaining AFS 134 are near the top surfaces 135b of the recess 126, the amount of secondary etchants 138 is greatest near the top surfaces 135b. Thus, surface material near the top surfaces 135b of the recess 126 is additionally etched by the secondary etchants 138 more than surface material near the bottom surfaces 135a of the recess. In some cases, some surfaces of the recess 126 may not be additionally etched by secondary etchants 138, for example if no AFS 134 is present over those surfaces or if AFS 134 is thin over those surfaces. The additional etching may be isotropic or anisotropic, depending on the specific secondary etchants 138 present. The additional etching may be performed in the same chamber as the surface modification process or the initial pumping stage.

Figure 10F:
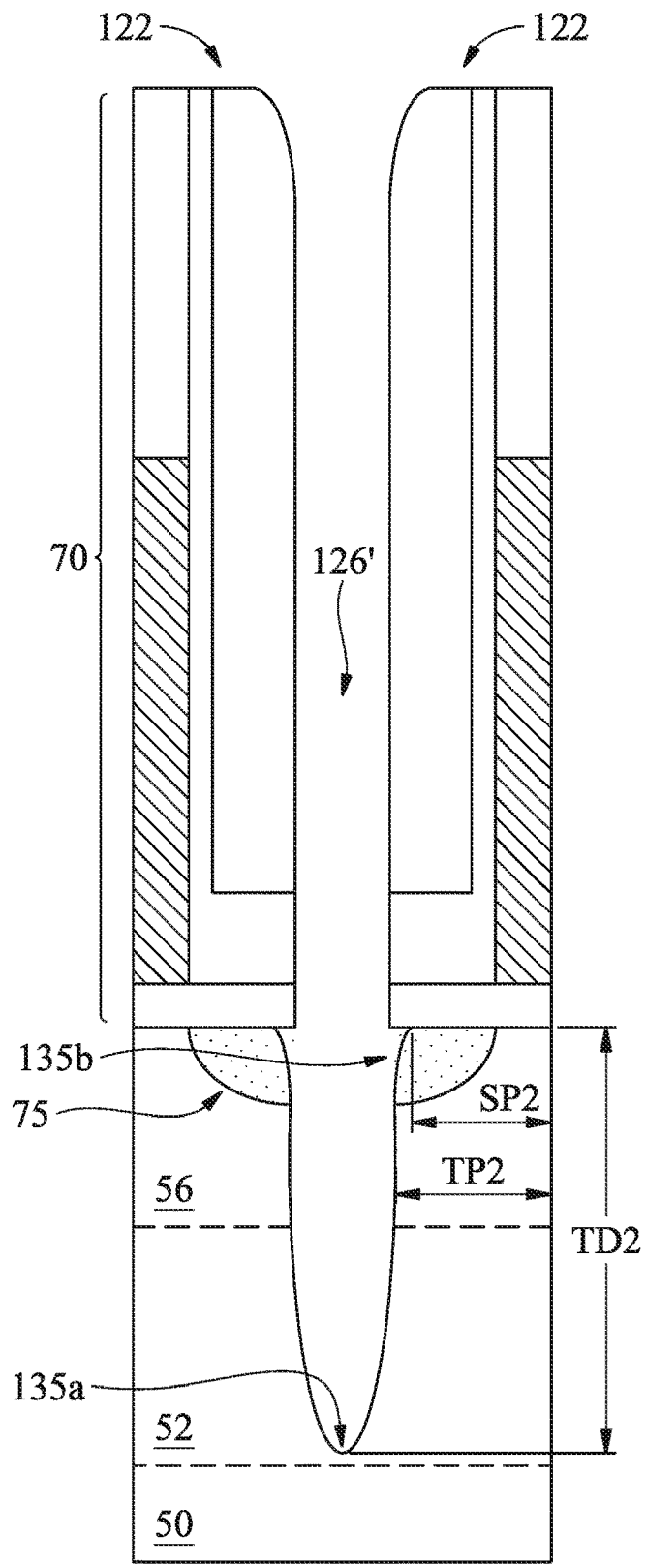

FIG. 10F illustrates the recess 126 after the secondary etchants 138 have additionally etched portions of the surface material and after the AFS 134 has been removed. The AFS 134 is removed during subsequent process steps, which are described in greater detail below. As FIG. 10F shows, the top surfaces 135b of the recess 126 have been etched more than the bottom surfaces 135a of the recess 126. In particular, with reference to FIG. 10A and FIG. 10F, the surface proximity is reduced from $SP_1$ to $SP_2$ more than the tip proximity is reduced from $TP_1$ to $TP_2$ and more than the trench depth is increased from $TD_1$ to $TD_2$. In some embodiments, the additional etching due to the secondary etchants 138 reduces the surface proximity between about 0.5 nm and about 1.5 nm, such as about 1.3 nm. In some embodiments, the additional etching reduces the tip proximity less than about 1 nm. In some embodiments, the additional etching increases the trench depth less than about 0.1 nm. In some cases, the additional etching can increase the diameter of the top of the recess 126 more than the additional etching increases the lateral diameter of portions of the recess 126 below the top of the recess 126. In some embodiments, the amount and distribution of the additional etching may be controlled by controlling the surface modification process characteristics or the initial pumping stage characteristics, as described previously. In some cases, the additional etching can give recess 126 a flared or "trumpet" shape, as showed in in FIG. 10F, though in other cases portions of the sides of the recess 126 may be straight.

In some cases, the use of the additional etching as described herein can reduce the amount of process residue or undesired impurities (e.g., C, O, N, Cl, F, or other substances) present on surfaces of the recess 126. For example, in some cases, the additional etching can reduce the concentration of C impurities by about 28%, the concentration of O impurities by about 95%, the concentration of N impurities by about 63%, the concentration of Cl impurities by about 53%, or the concentration of F impurities by about 33%. In other cases, the additional etching may reduce different amounts of impurities than these illustrative examples.

By shaping the recess 126, the additional etching of recess 126 described in FIGS. 10A-10F also shapes the fins 56. The additional etching thus can shape the fins 56 such that the top of each fin 56 has a smaller width between each recess 126, as indicated by the reduction of surface proximity described above. The additional etching can reduce the width of portions of a fin 56 in a region closer to the gate stack (i.e., near the top of the fin 56) more than the additional etching reduces the width of portions of the fin 56 in a region farther from the gate stack (i.e., near the bottom of the fin 56). In this manner, the additional etching can increase the tapering of sidewalls of a 56, or increase the slope of sidewalls of a fin 56, particularly near the top of the fin 56.

One or more secondary etchants 138 may form from absorbed initial etchants 136 within the AFS 134. For example, $NH_3$ can react with $H_2O$ also present in the AFS 134 to form ammonium hydroxide ($NH_4OH$), which is an etchant of silicon:

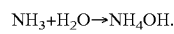

As another example, HF* and F* radicals present in the AFS 134 also can attack silicon according to the reaction

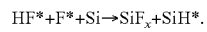

In some cases, some of the radicals absorbed into the AFS 134 may be electrically neutral. These example secondary etchants can etch surfaces of a recess formed in a silicon substrate. In some embodiments, other types of secondary etchants may be formed that etch silicon. In some embodiments, types of secondary etchants may be formed that etch other types of substrates than silicon. In some embodiments, the different types, amounts, relative proportions, or other characteristics of the secondary etchants may be controlled by controlling the surface modification process characteristics or the initial pumping stage characteristics, as described previously. In some embodiments, other gases than surface modification process gases may be introduced into the surface modification process chamber to form etchants within the AFS 134. In some cases, the additional etching is self-limited. For example, the additional etching stops after the secondary etchants 138 are depleted if the absorbed initial etchants 136 or reactive byproducts are not replenished within the AFS 134. In this manner, the amount of additional etching can be controlled by controlling the absorption of initial etchants 136 into the AFS 134. For example, the duration of exposure, the pressure, the flow rate, or the ratio of process gases may be controlled, though controlling other characteristics may also control the amount of initial etchants 136 absorbed or secondary etchants 138 created.

After the additional etching due to the secondary etchants 138, a second pumping stage may be performed to remove the AFS 134 and any other materials within the AFS, such as absorbed initial etchants 136, secondary etchants 138, etchant byproducts, etc. In some embodiments, the process pressure during the second pumping stage may be less than about 1 mTorr. In some embodiments, the duration of the second pumping stage may be between about 10 seconds and about 30 seconds. In some embodiments, the temperature during the second pumping stage may be greater than about 75° C., such as about 90° C., to facilitate sublimation of the AFS 134 and improve pumping efficiency. In some embodiments, the second pumping stage may be performed to stop the additional etching due to the secondary etchants 138, or the second pumping stage may be performed after the additional etching has stopped due to self-limiting effects. In some embodiments, the second pumping stage may be performed a certain predetermined duration of time after the initial pumping stage to control the amount of additional etching.

Figure 11A:
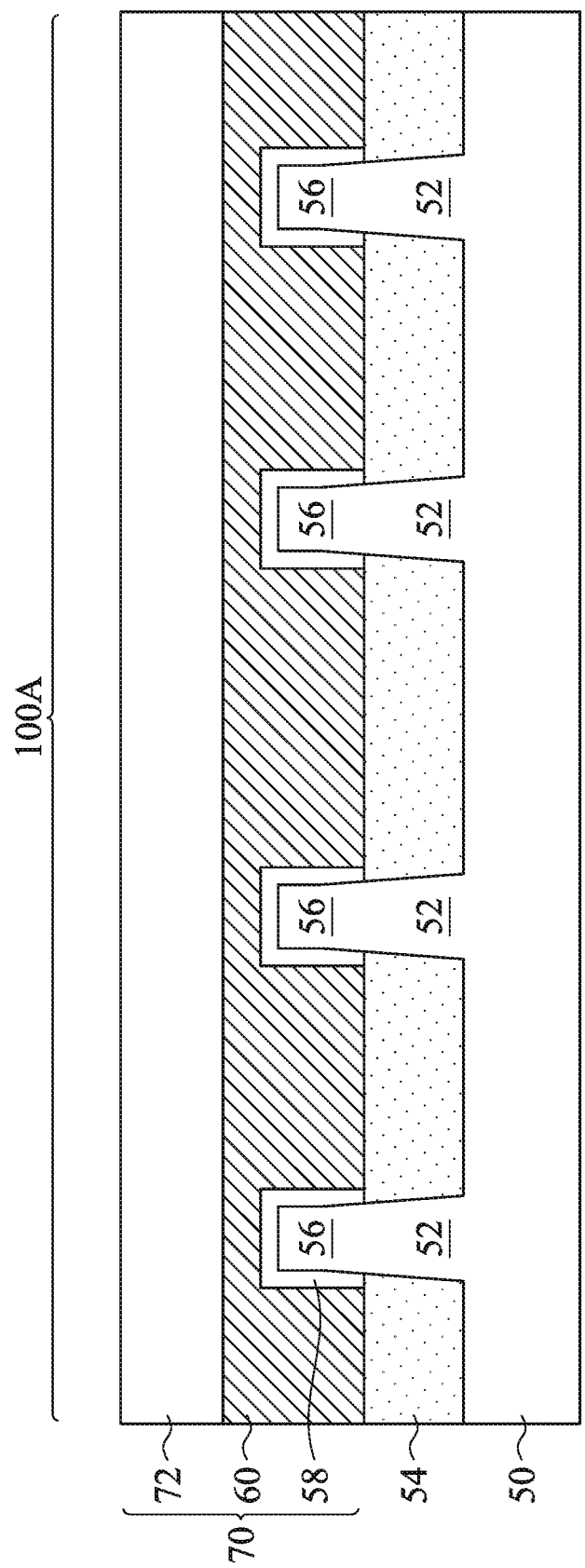
FIGS. 11A-11C are cross-sectional views of intermediate stages in the manufacture of a FinFET device in accordance with some embodiments.
Figure 11B:
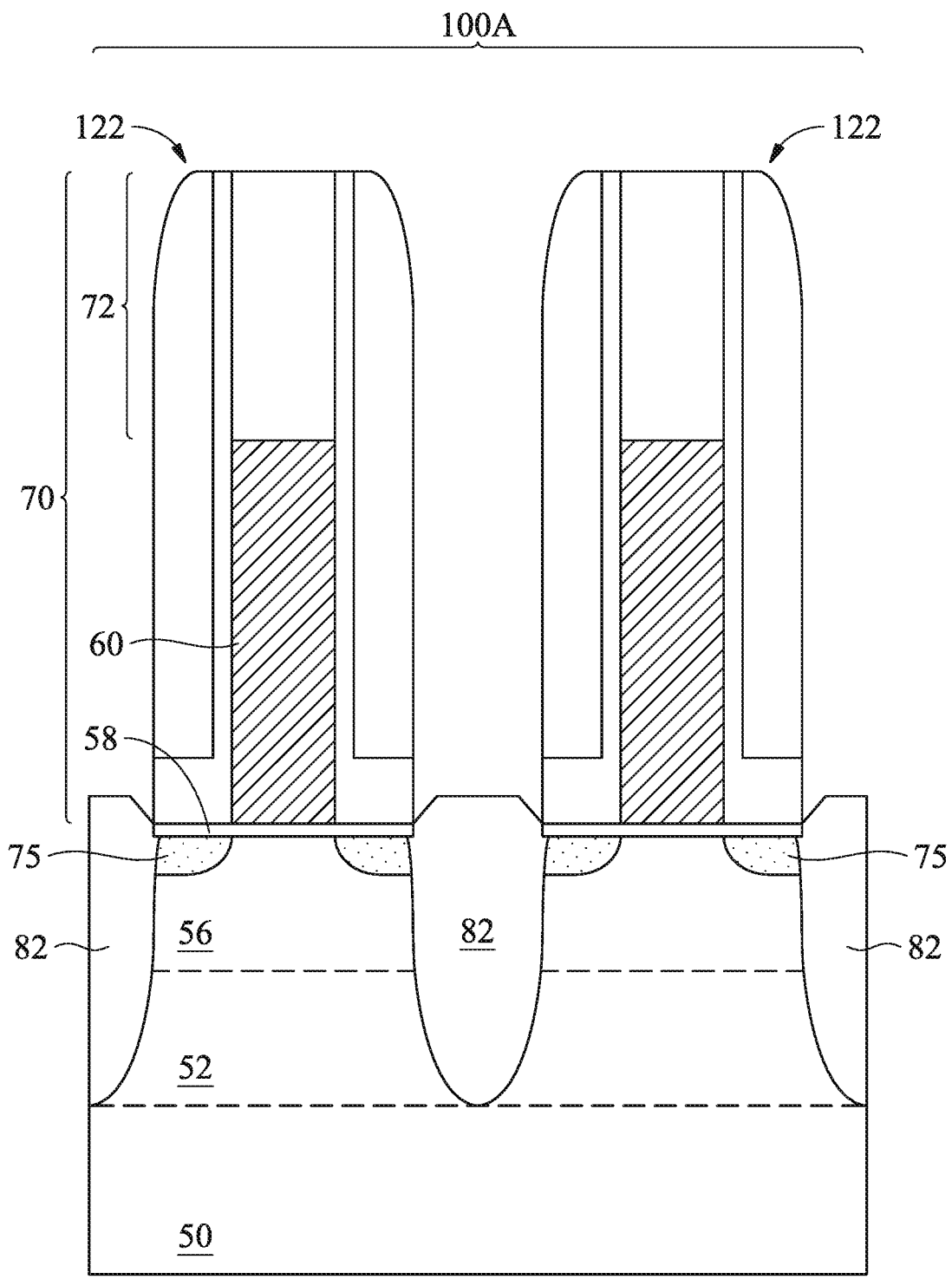
Figure 11C:
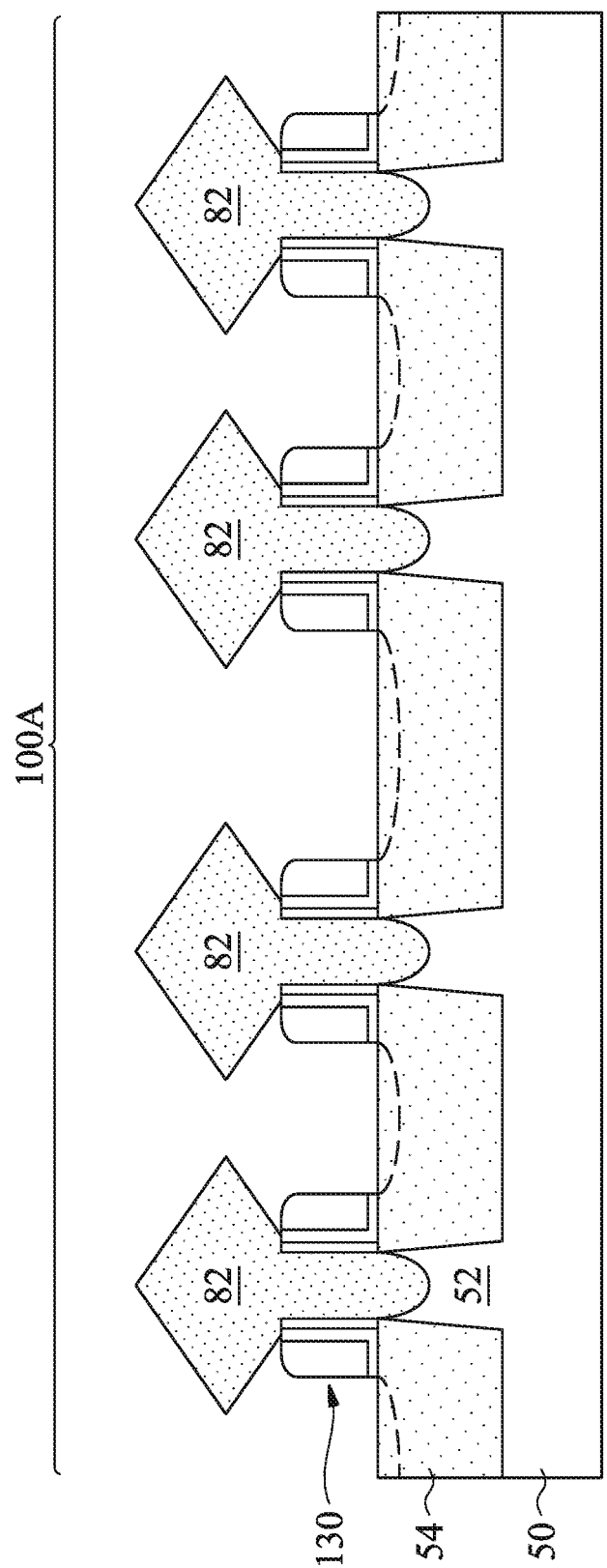
Figure 17A:
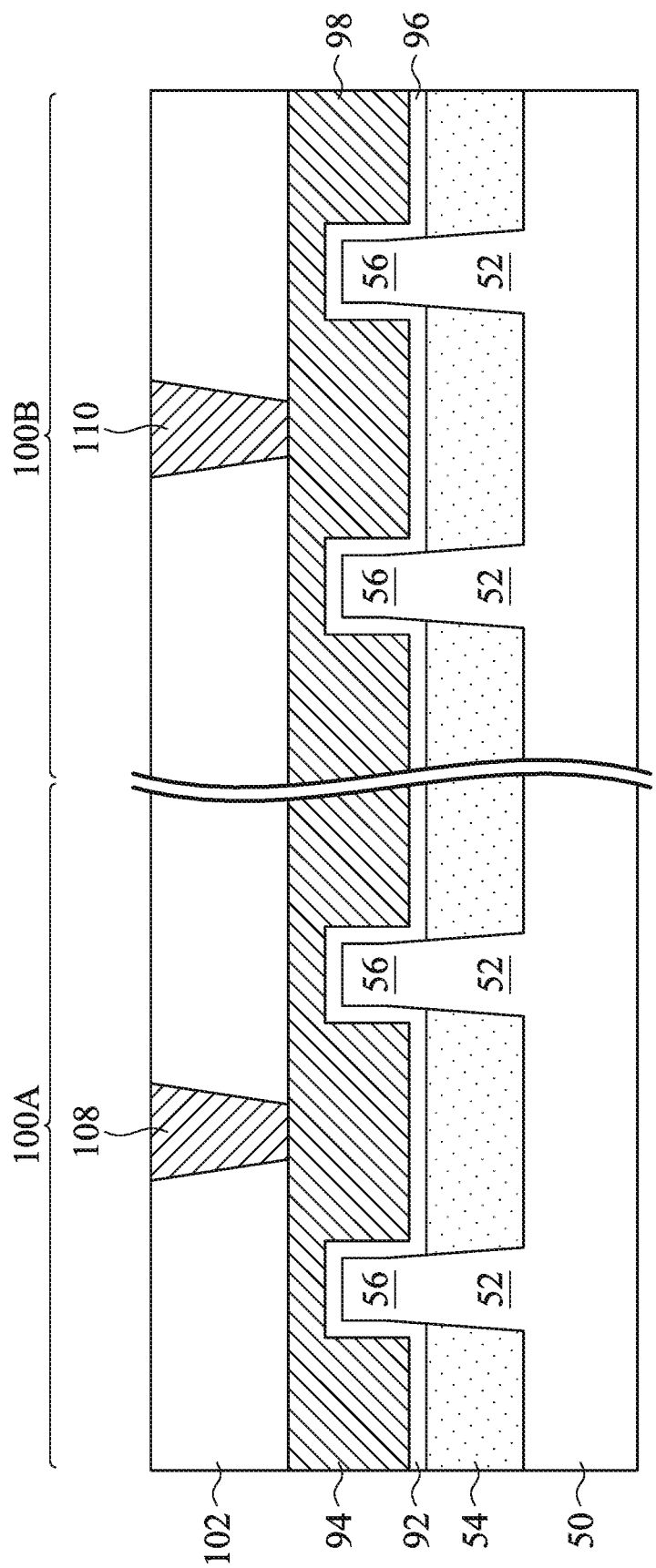
FIGS. 17A-17C are cross-sectional views of intermediate stages in the manufacture of a FinFET device in accordance with some embodiments.
Figure 17B:
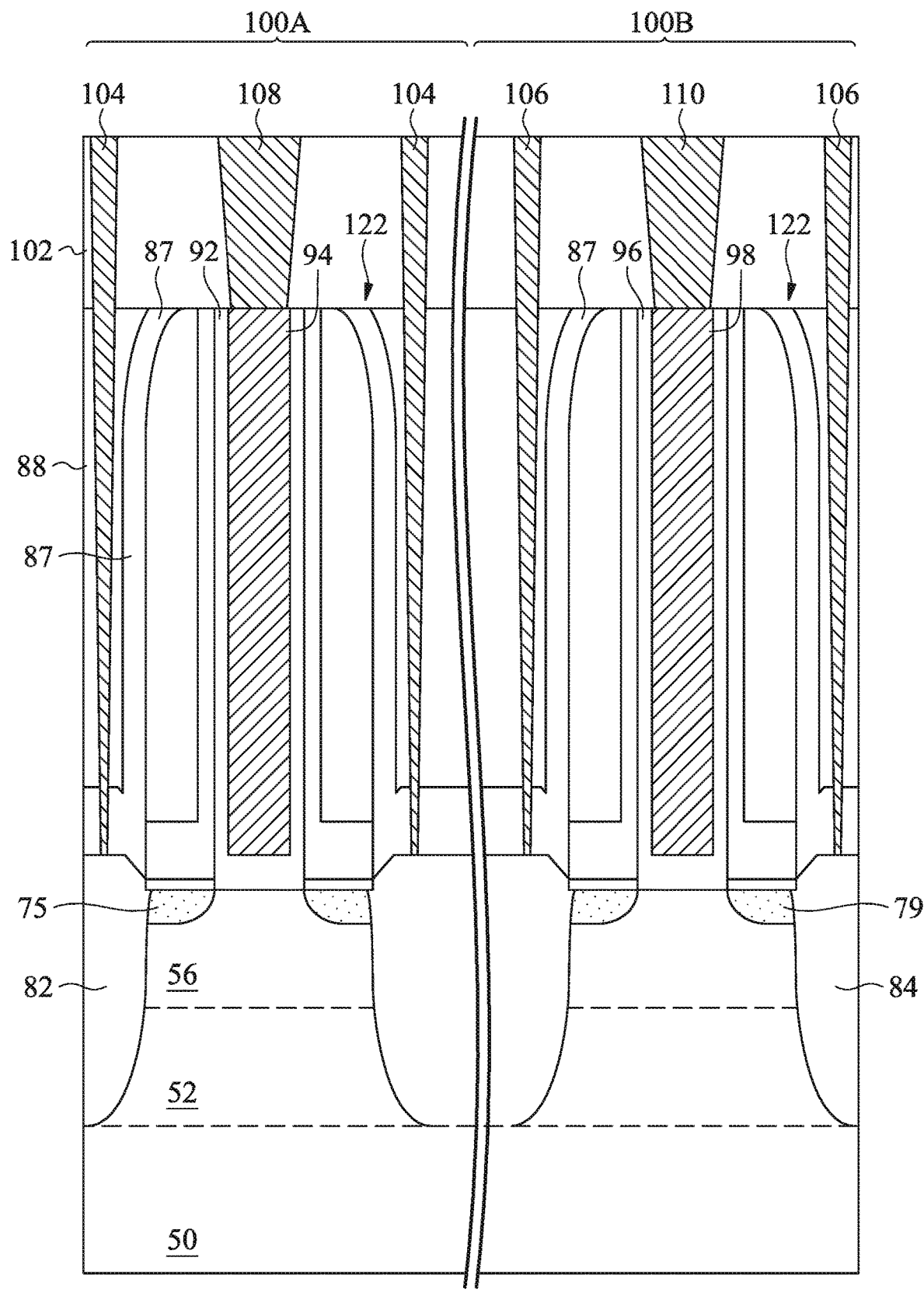
Figure 17C:
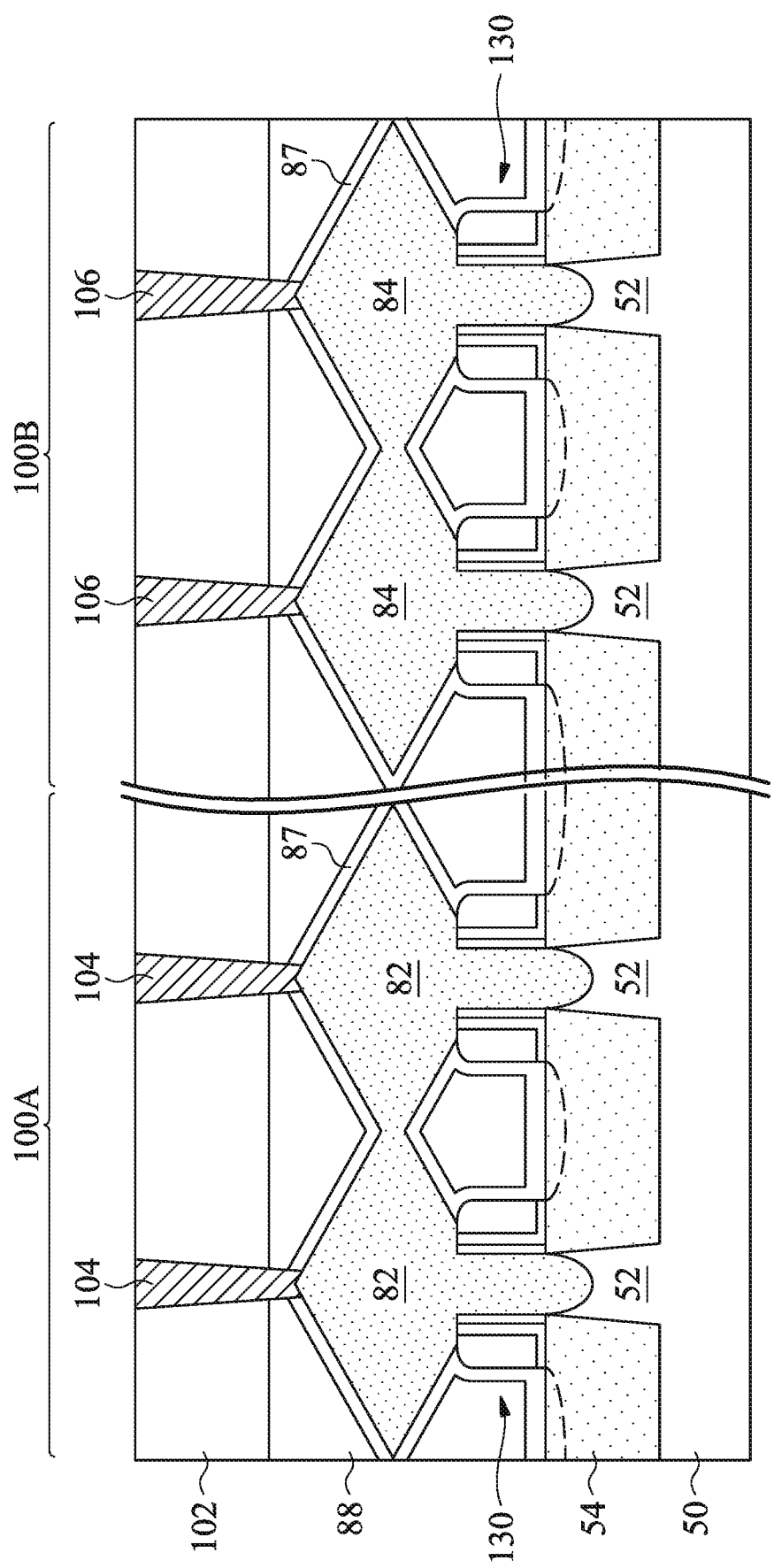

FIGS. 11A, 11B, and 11C illustrate the formation of epitaxial source/drain regions 82 in the first region 100A. In some embodiments, the epitaxial source/drain regions 82 are epitaxially grown in the recesses 126 using metal-organic CVD (MOCVD), molecular beam epitaxy (MBE), liquid phase epitaxy (LPE), vapor phase epitaxy (VPE), selective epitaxial growth (SEG), a combination thereof, or the like. The epitaxial source/drain regions 82 may include any acceptable material, such as any material that is appropriate for n-type FinFETs. For example, if the fin 56 is silicon, the epitaxial source/drain regions 82 may include silicon, SiC, SiCP, SiP, or the like. The epitaxial source/drain regions 82 may have surfaces raised from respective surfaces of the fins 56 and may have facets. The epitaxial source/drain regions 82 are formed in the fins 56 such that each dummy gate stack 70 is disposed between respective neighboring pairs of the epitaxial source/drain regions 82. In some embodiments the epitaxial source/drain regions 82 in the first region 100A may be implanted with dopants, similar to the process previously discussed for forming the LDD regions 75, followed by an anneal (see FIGS. 8A, 8B, and 8C). The epitaxial source/drain regions 82 may have an impurity concentration of in a range from about $10^{19}$ cm$^{-3}$ to about $10^{21}$ cm$^{-3}$. The n-type impurities for source/drain regions in the first region 100A, e.g., the NMOS region, may be any of the n-type impurities previously discussed. In other embodiments, the material of the epitaxial source/drain regions 82 may be in situ doped during growth. In the illustrated embodiments, each of the source/drain regions 82 is physically separate from other source/drain regions 82. In other embodiments, two or more adjacent source/drain regions 82 may be merged. Such an embodiment is depicted in FIGS. 17A, 17B, and 17C, such that two adjacent source/drain regions 82 are merged to form a common source/drain region. In some embodiments, more than two adjacent source/drain regions 82 may be merged.

Figure 12A:
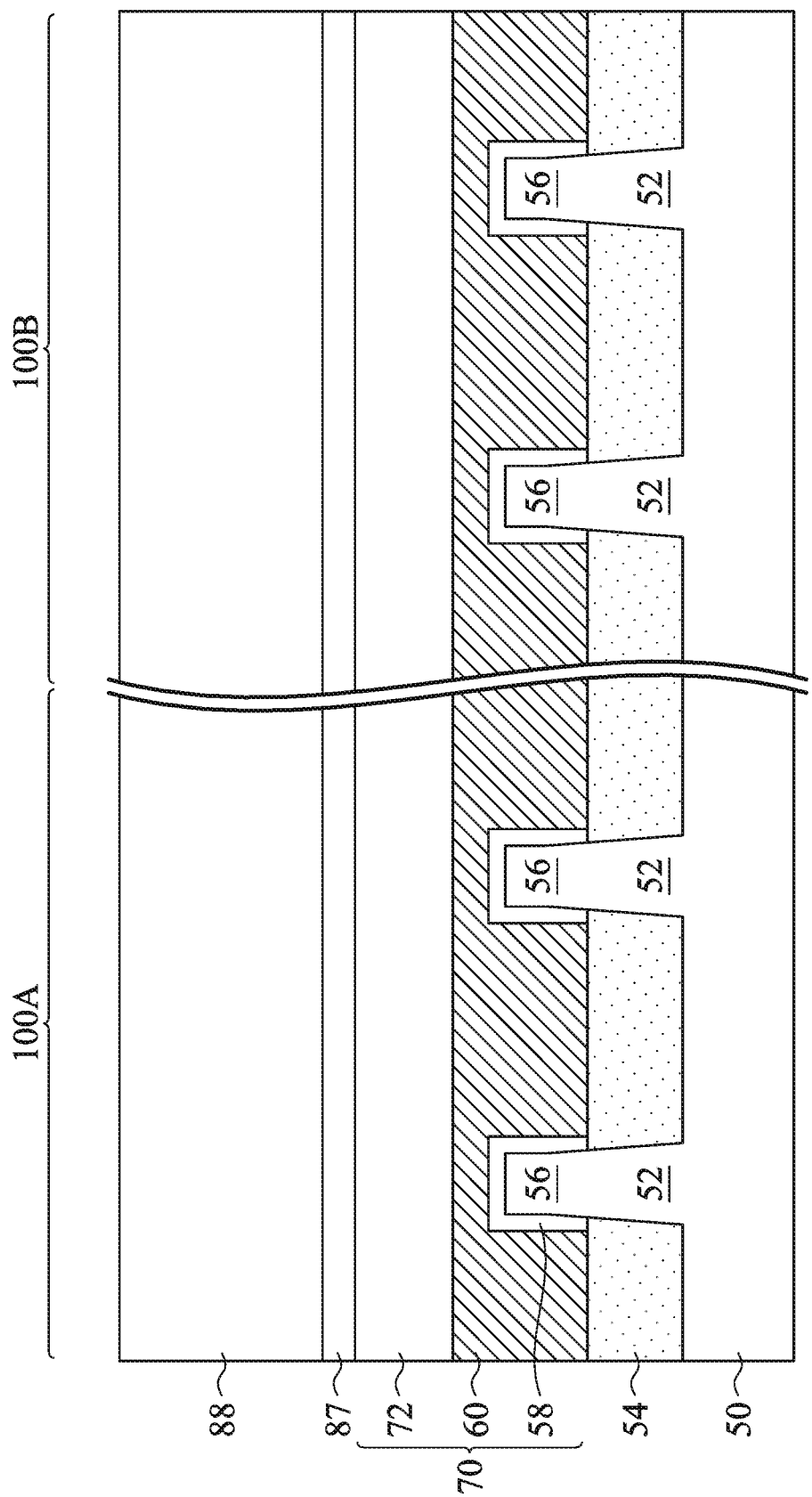
FIGS. 12A-12C are cross-sectional views of intermediate stages in the manufacture of a FinFET device in accordance with some embodiments.
Figure 12B:
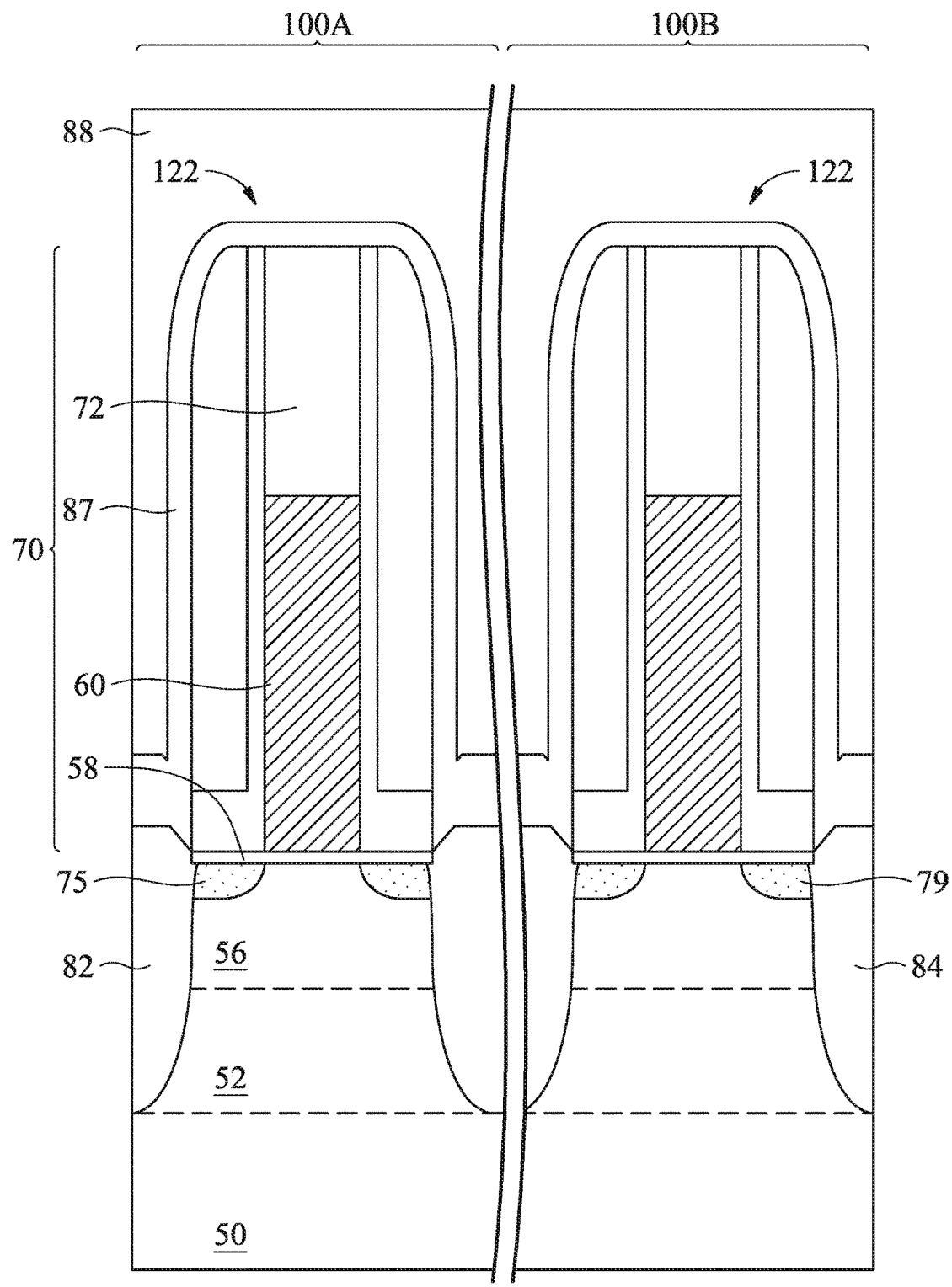
Figure 12C:
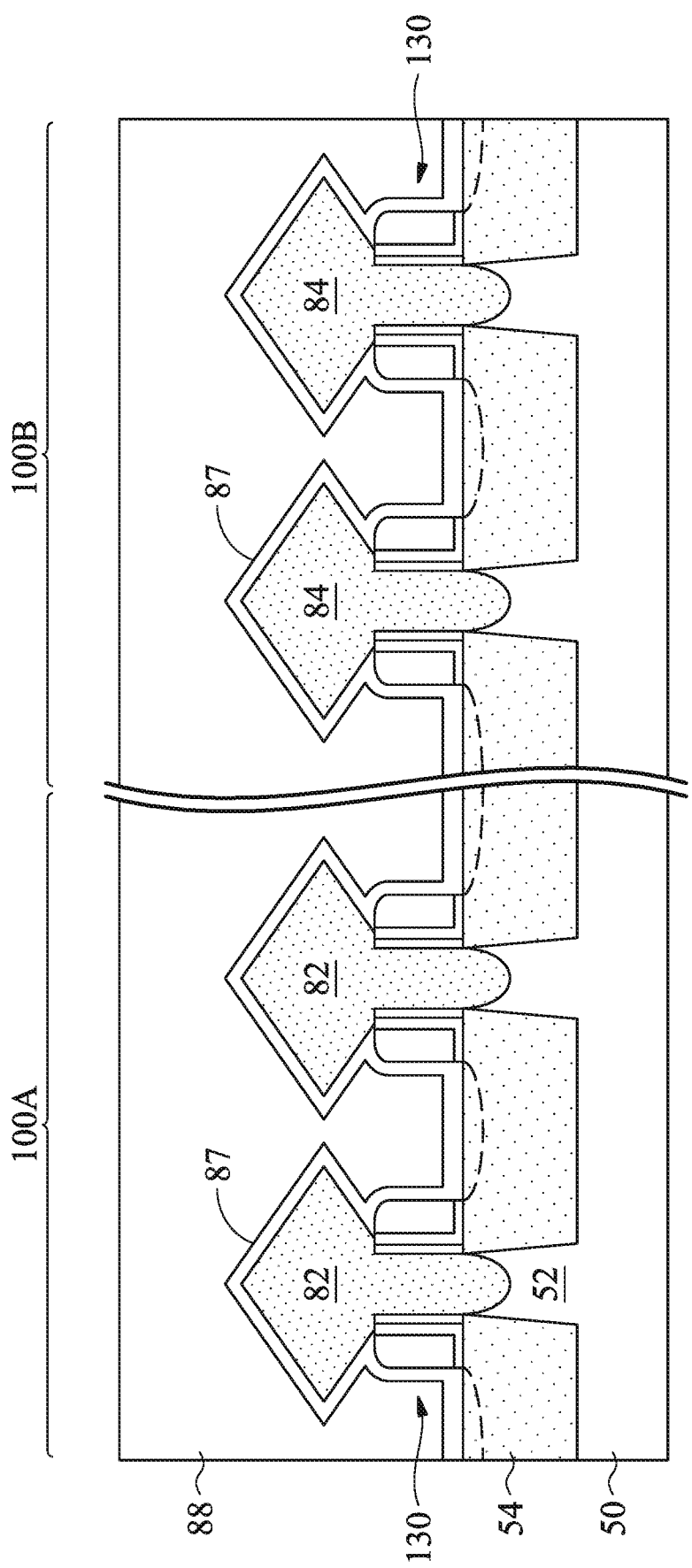

Referring to FIGS. 12A, 12B, and 12C, after forming the epitaxial source/drain regions 82 in the first region 100A, the epitaxial source/drain regions 84 are formed in the second region 100B. In some embodiments, the epitaxial source/ drain regions 84 are formed in the second region 100B using similar methods as the epitaxial source/drain regions 82 described above with reference to FIGS. 10A through 11C, and the detailed description is not repeated for the sake of brevity. In some embodiments, during the formation of the epitaxial source/drain regions 84 in the second region 100B, e.g., the PMOS region, the first region 100A, e.g., the NMOS region may be masked (not shown). Subsequently, the source/drain regions of the fins 56 in the second region 100B are etched to form recesses (shown as filled with the epitaxial source/drain regions 84 in FIGS. 12B and 12C) similar to the recesses 126 (See FIGS. 10A-10F). The recesses in the second region 100B may be formed using similar method as the recesses 126 in the first region, described above with reference to FIGS. 10A-10F, and the description is not repeated herein for the sake of brevity.

Next, the epitaxial source/drain regions 84 in the second region 100B are epitaxially grown in the recesses using MOCVD, MBE, LPE, VPE, SEG, a combination thereof, or the like. The epitaxial source/drain regions 84 may include any acceptable material, such as any material that is appropriate for p-type FinFETs. For example, if the fin 56 is silicon, the epitaxial source/drain regions 84 may comprise SiGe, SiGeB, Ge, GeSn, or the like. The epitaxial source/ drain regions 84 may have surfaces raised from respective surfaces of the fins 56 and may have facets. In the second region 100B, epitaxial source/drain regions 84 are formed in the fins 56 such that each dummy gate 70 is disposed between respective neighboring pairs of the epitaxial source/ drain regions 84. In some embodiments epitaxial source/ drain regions 84 may extend past the fins 56 and into the semiconductor strips 52.

The material of the epitaxial source/drain regions 84 in the second region 100B may be implanted with dopants, similar to the process previously discussed for forming the LDD regions 79, followed by an anneal (see FIGS. 8A, 8B, and 8C). The source/drain regions 84 may have an impurity concentration in a range from about $10^{19}$ cm$^{-3}$ to about $10^{21}$ cm$^{-3}$. The p-type impurities for the source/drain regions 84 in the second region 100B, e.g., the PMOS region, may be any of the p-type impurities previously discussed. In other embodiments, the epitaxial source/drain regions 84 may be in situ doped during growth. Portions of the epitaxial source/ drain regions 82 and 84 that are formed near the top surfaces 135b of the recess 126 may have curved sidewalls or substantially straight sidewalls. Portions of the epitaxial source/drain regions 82 and 84 that are formed near the top surfaces 135b of the recess 126 may physically contact the underside of the dummy dielectric layer 58. In the illustrated embodiments, each of the source/drain regions 84 is physically separate from other source/drain regions 84. In other embodiments, two or more adjacent source/drain regions 84 may be merged. Such an embodiment is depicted in FIGS. 17A, 17B, and 17C, such that two adjacent source/drain regions 84 are merged to form a common source/drain region. In some embodiments, more than two adjacent source/drain regions 84 may be merged.

The use of the additional etching of the recess to reshape the fin can decrease the width of the fin near the top of the fin more the rest of the fin, giving the fin a tapered, trapezoidal, or flared shape. In some cases, reshaping the fin in this manner can improve device performance. For example, it has been observed that fins having a narrower top as described herein can increase the current density within the fin during device operation, which can improve the $I_{ON}$ characteristics of the device. In some cases, reshaping the fin as described herein may improve the DC gain of a FinFET device by more than 1%. It has also been observed that fins having the shape as described herein can also reduce the amount of $I_{OFF}$ leakage current of the device.

Referring further to FIGS. 12A, 12B, and 12C, an etch stop layer 87 and an interlayer dielectric (ILD) 88 are deposited over the dummy gate stacks 70, and over the source/drain regions 82 and 84. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, PECVD, a combination thereof, or the like. In some embodiments, the etch stop layer 87 is used as a stop layer while patterning the ILD 88 to form openings for subsequently formed contacts. Accordingly, a material for the etch stop layer 87 may be chose such that the material of the etch stop layer 87 has a lower etch rate than the material of ILD 88.

Figure 13A:
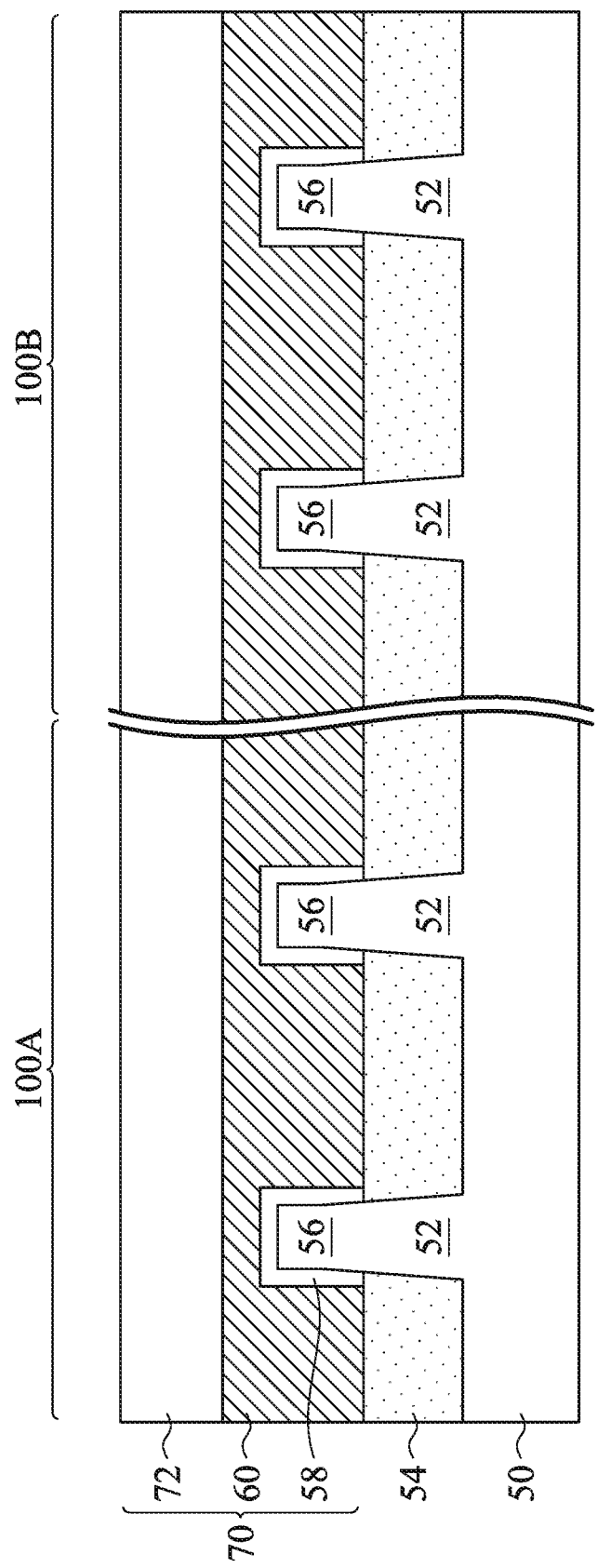
FIGS. 13A-13C are cross-sectional views of intermediate stages in the manufacture of a FinFET device in accordance with some embodiments.
Figure 13B:
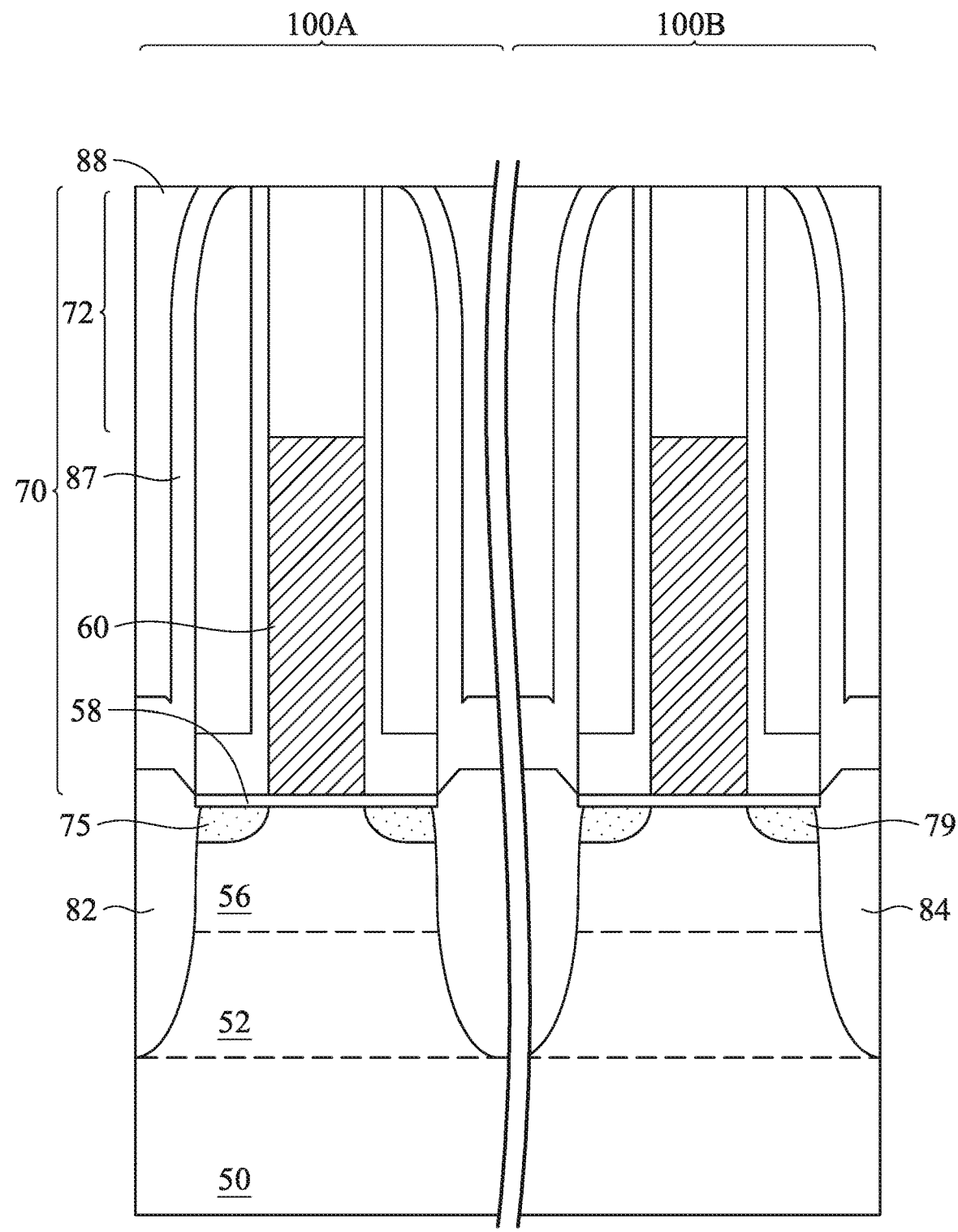
Figure 13C:
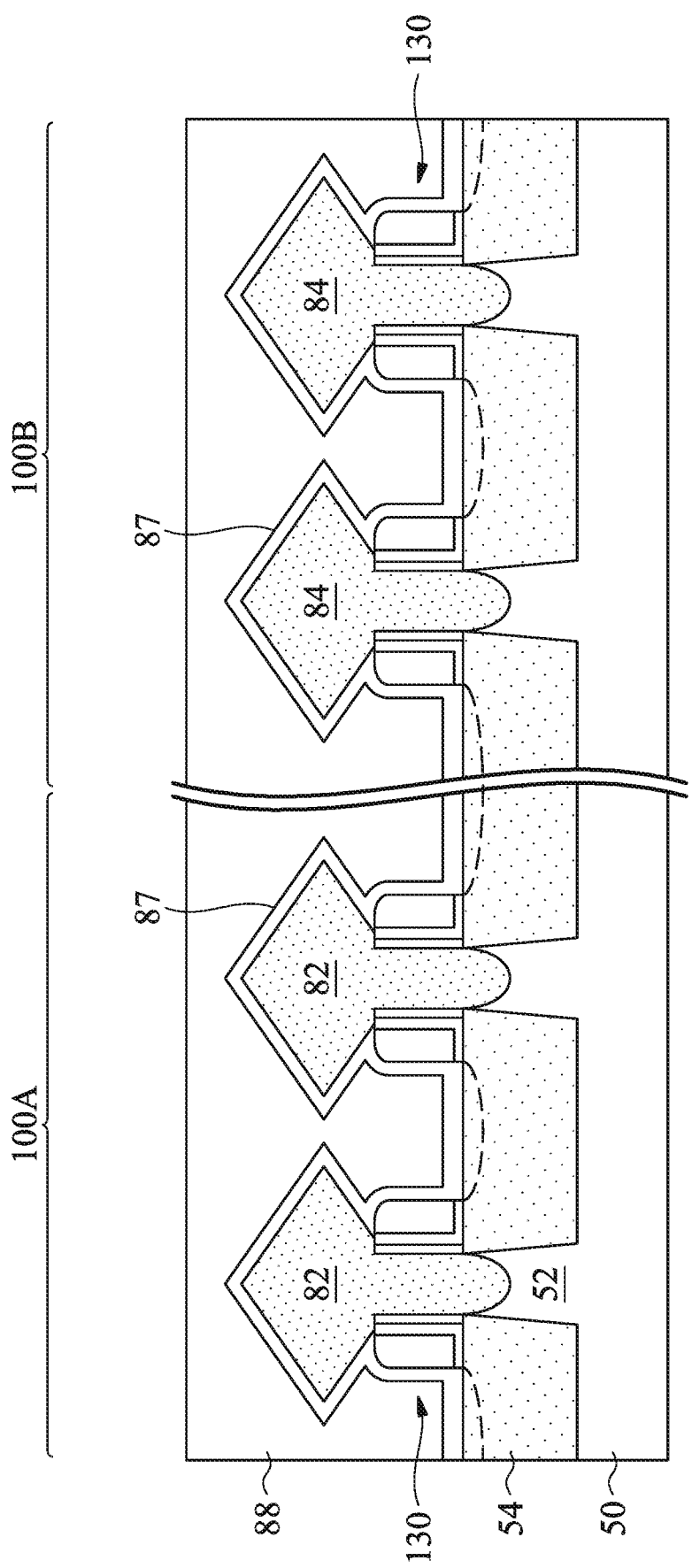

Referring to FIGS. 13A, 13B, and 13C, a planarization process, such as a CMP, may be performed to level the top surface of ILD 88 with the top surfaces of the dummy gate stacks 70. After the planarization process, top surfaces of the dummy gate stacks 70 are exposed through the ILD 88. In some embodiments, the CMP may also remove the mask 72, or portions thereof, on the dummy gate stacks 70.

Figure 14A:
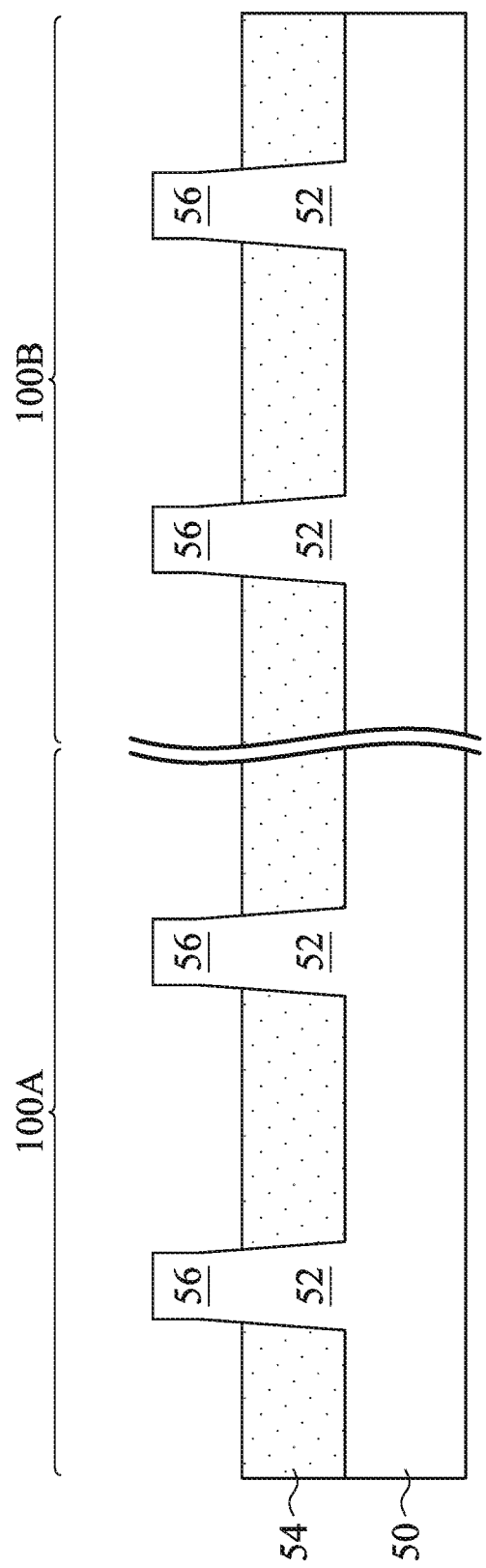
FIGS. 14A-14C are cross-sectional views of intermediate stages in the manufacture of a FinFET device in accordance with some embodiments.
Figure 14B:
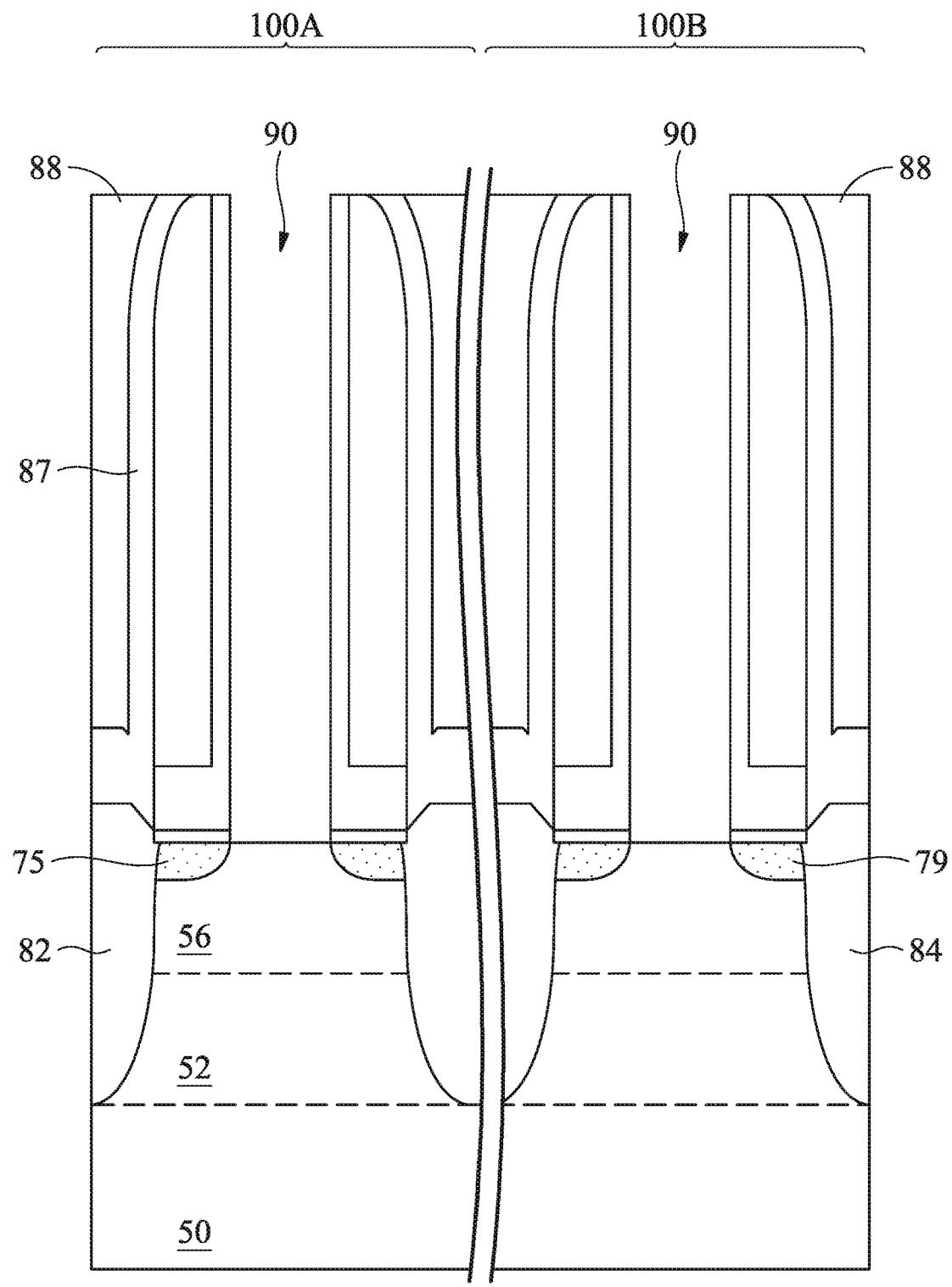
Figure 14C:
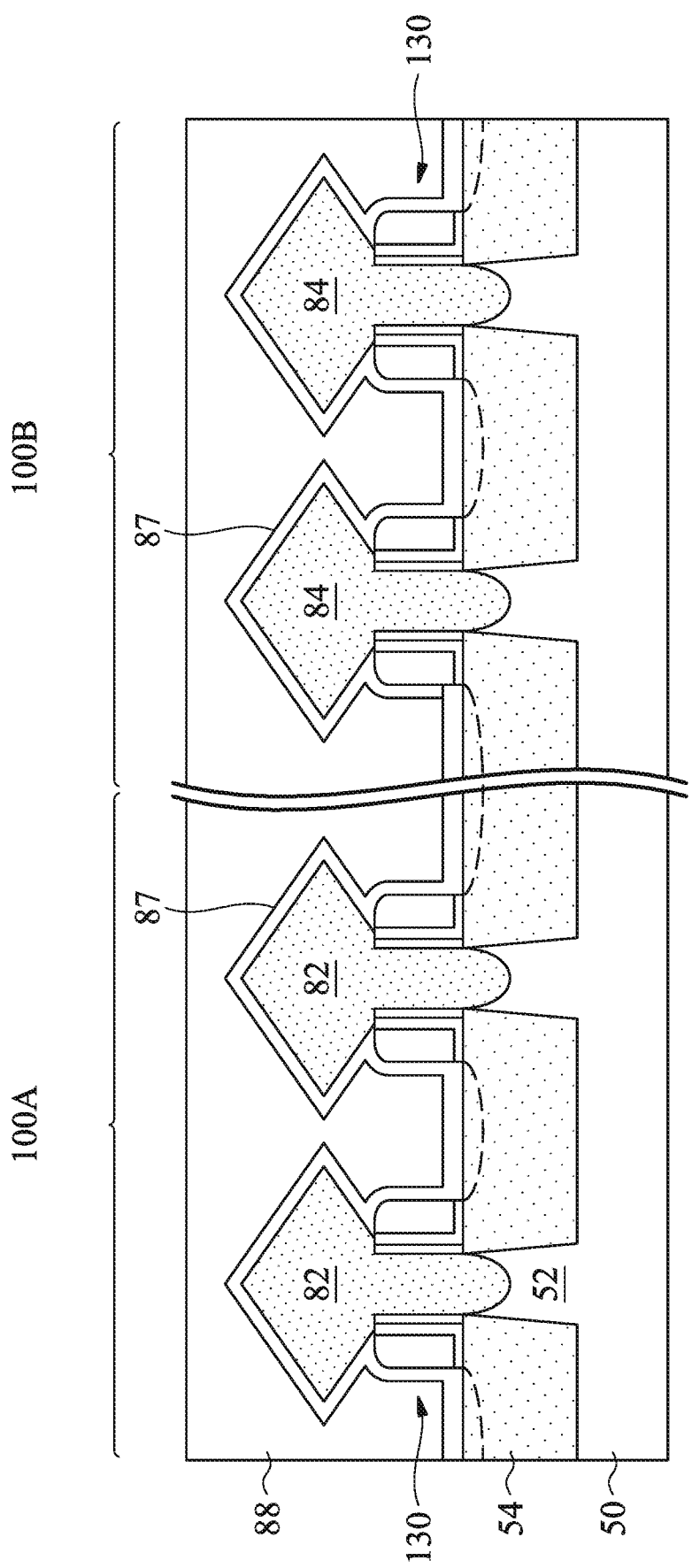

Referring to FIGS. 14A, 14B, and 14C, remaining portions of mask 72 and the dummy gate stacks 70 are removed in an etching step(s), so that recesses 90 are formed. Each of the recesses 90 exposes a channel region of a respective fin 56. Each channel region is disposed between neighboring pairs of the epitaxial source/drain regions 82 in the first region 100A or between neighboring pairs of the epitaxial source/drain regions 84 in the second region 100B. During the removal, the dummy dielectric layer 58 may be used as an etch stop layer when the dummy gate stacks 70 are etched. The dummy dielectric layer 58 may then be removed after the removal of the dummy gate stacks 70.

Figure 15A:
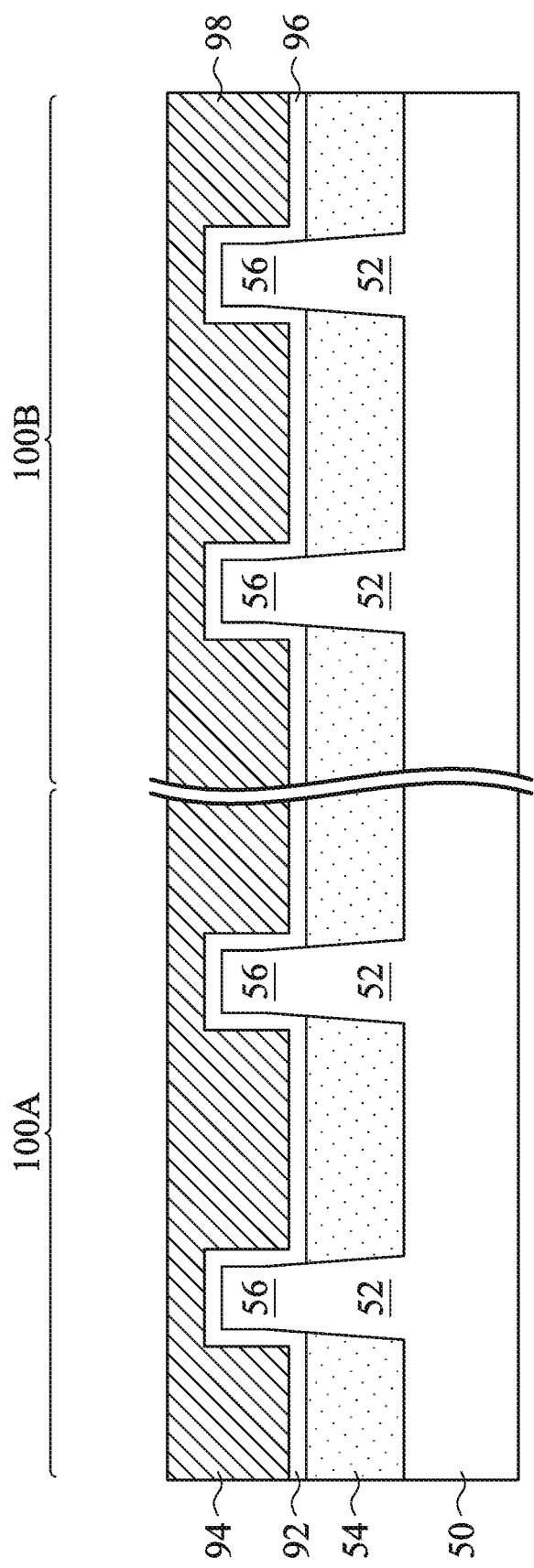
FIGS. 15A-15C are cross-sectional views of intermediate stages in the manufacture of a FinFET device in accordance with some embodiments.
Figure 15B:
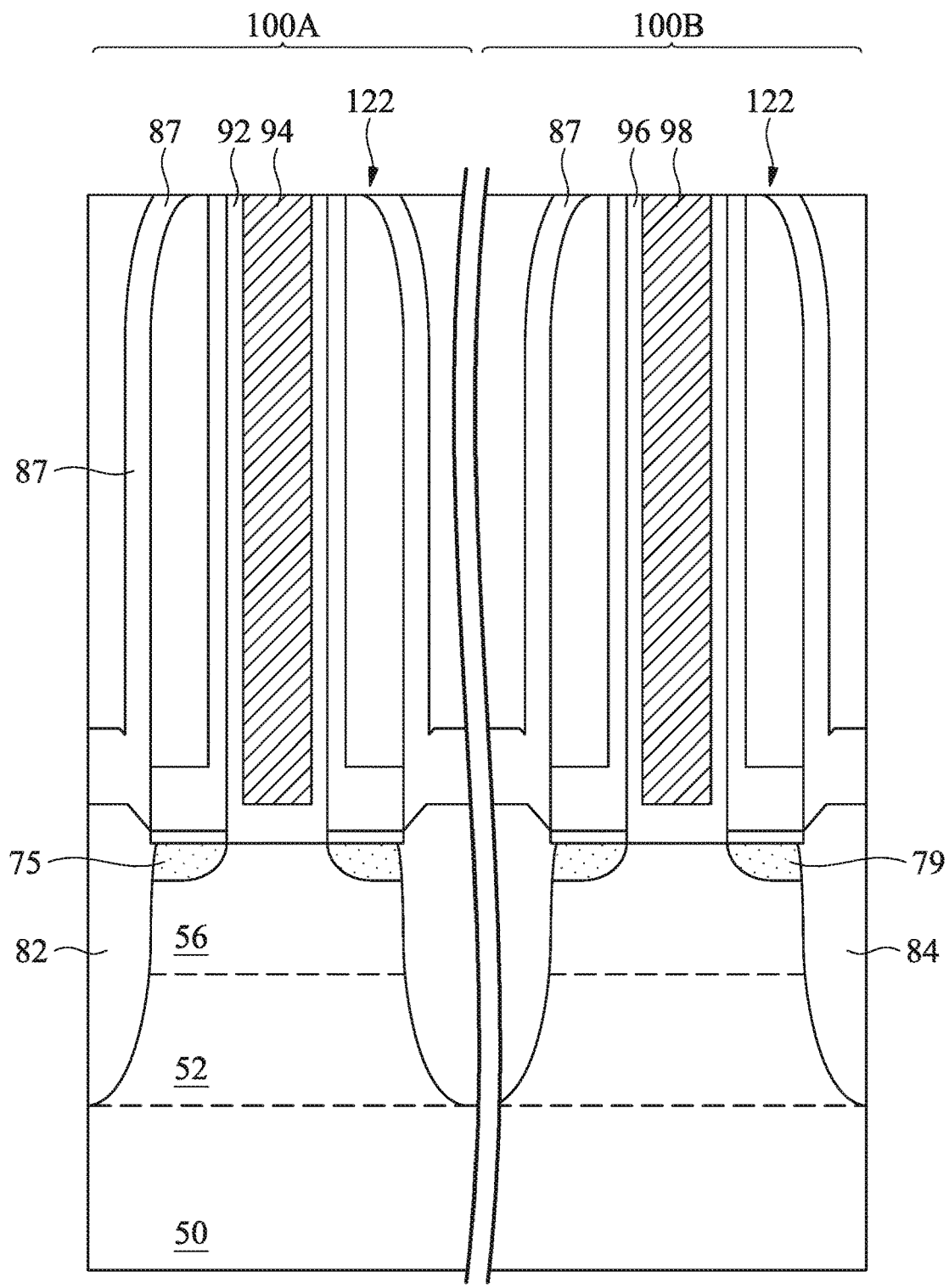
Figure 15C:
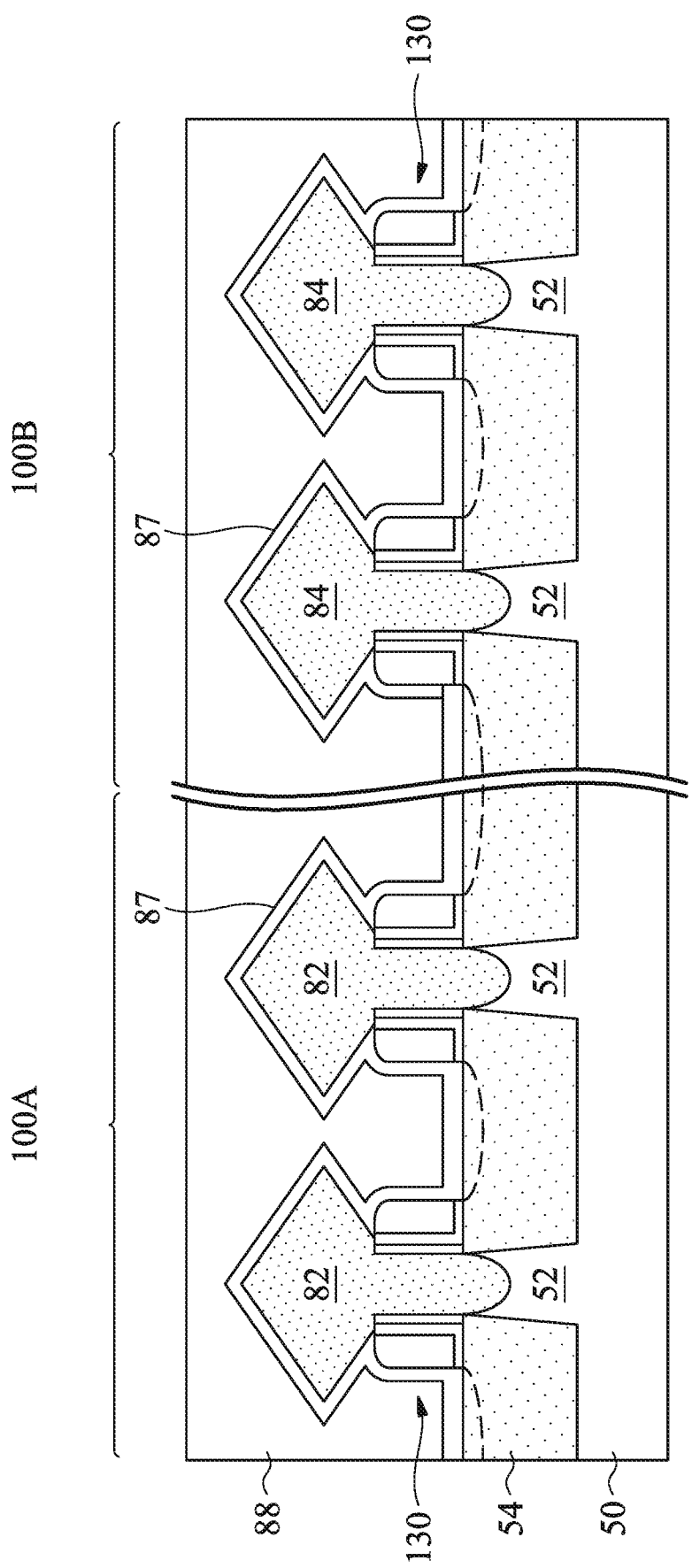

Referring to FIGS. 15A, 15B, and 15C, gate dielectric layers 92 and 96, and gate electrodes 94 and 98 are formed for replacement gates in the first region 100A and the second region 100B, respectively. The gate dielectric layers 92 and 96 are deposited conformally in the recesses 90, such as on the top surfaces and the sidewalls of the fins 56, on sidewalls of the gate spacers 122 and fin spacers 130, respectively, and on a top surface of the ILD 88. In some embodiments, the gate dielectric layers 92 and 96 comprise silicon oxide, silicon nitride, or multilayers thereof. In other embodiments, the gate dielectric layers 92 and 96 include a high-k dielectric material, and in these embodiments, the gate dielectric layers 92 and 96 may have a k value greater than about 7.0, and may include a metal oxide or a silicate of Hf, Al, Zr, La, Mg, Ba, Ti, Pb, and combinations thereof. The formation methods of the gate dielectric layers 92 and 96 may include Molecular-Beam Deposition (MBD), ALD, PECVD, a combination thereof, or the like.

Next, the gate electrodes 94 and 98 are deposited over the gate dielectric layers 92 and 96, respectively, and fill the remaining portions of the recesses 90. The gate electrodes 94 and 98 may be made of a metal-containing material such as TiN, TaN, TaC, Co, Ru, Al, Ag, Au, W, Ni, Ti, Cu, combinations thereof, or multilayers thereof. After the filling of the gate electrodes 94 and 98, a planarization process, such as a CMP, may be performed to remove the excess portions of the gate dielectric layers 92 and 96, and the gate electrodes 94 and 98, which excess portions are over the top surface of ILD 88. The resulting remaining portions of material of the gate electrodes 94 and 98, and the gate dielectric layers 92 and 96 thus form replacement gates of the resulting FinFETs.

In some embodiments, the formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

Figure 16A:
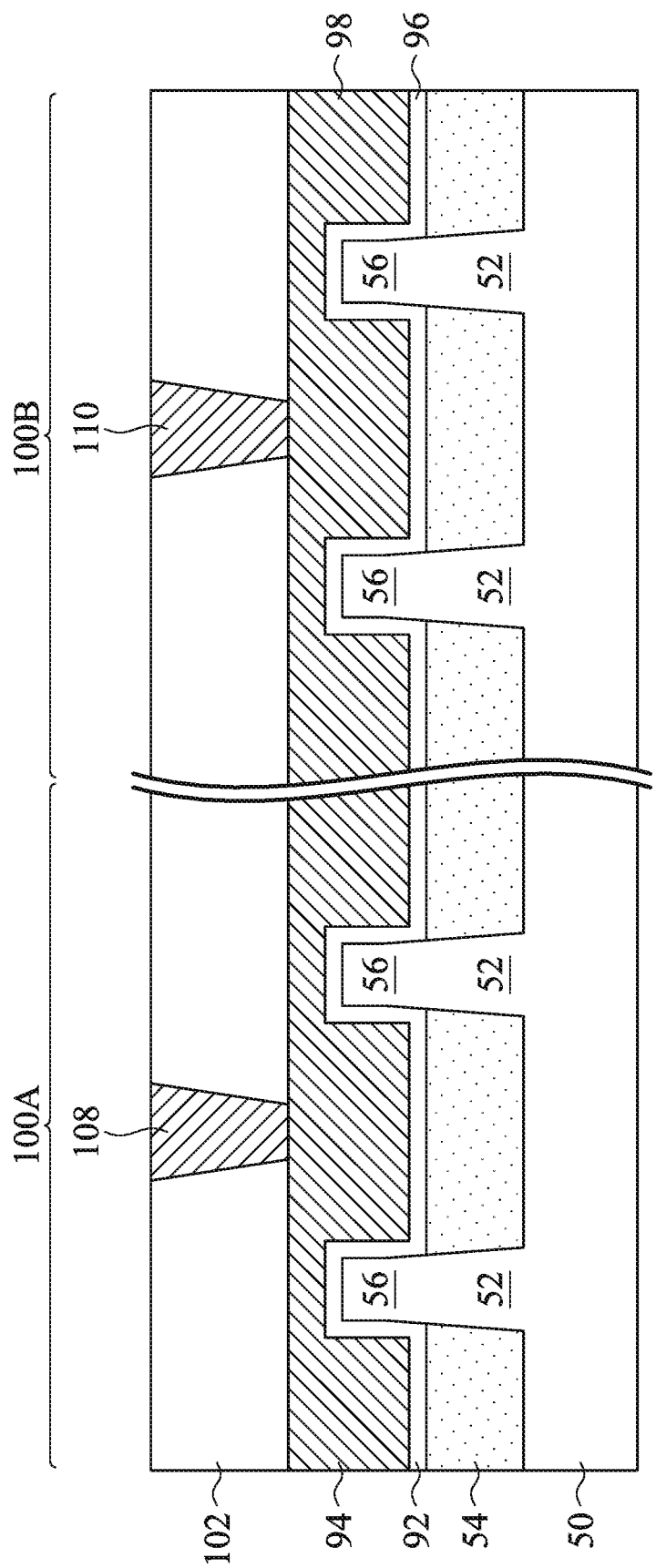
FIGS. 16A-16C are cross-sectional views of intermediate stages in the manufacture of a FinFET device in accordance with some embodiments.
Figure 16B:
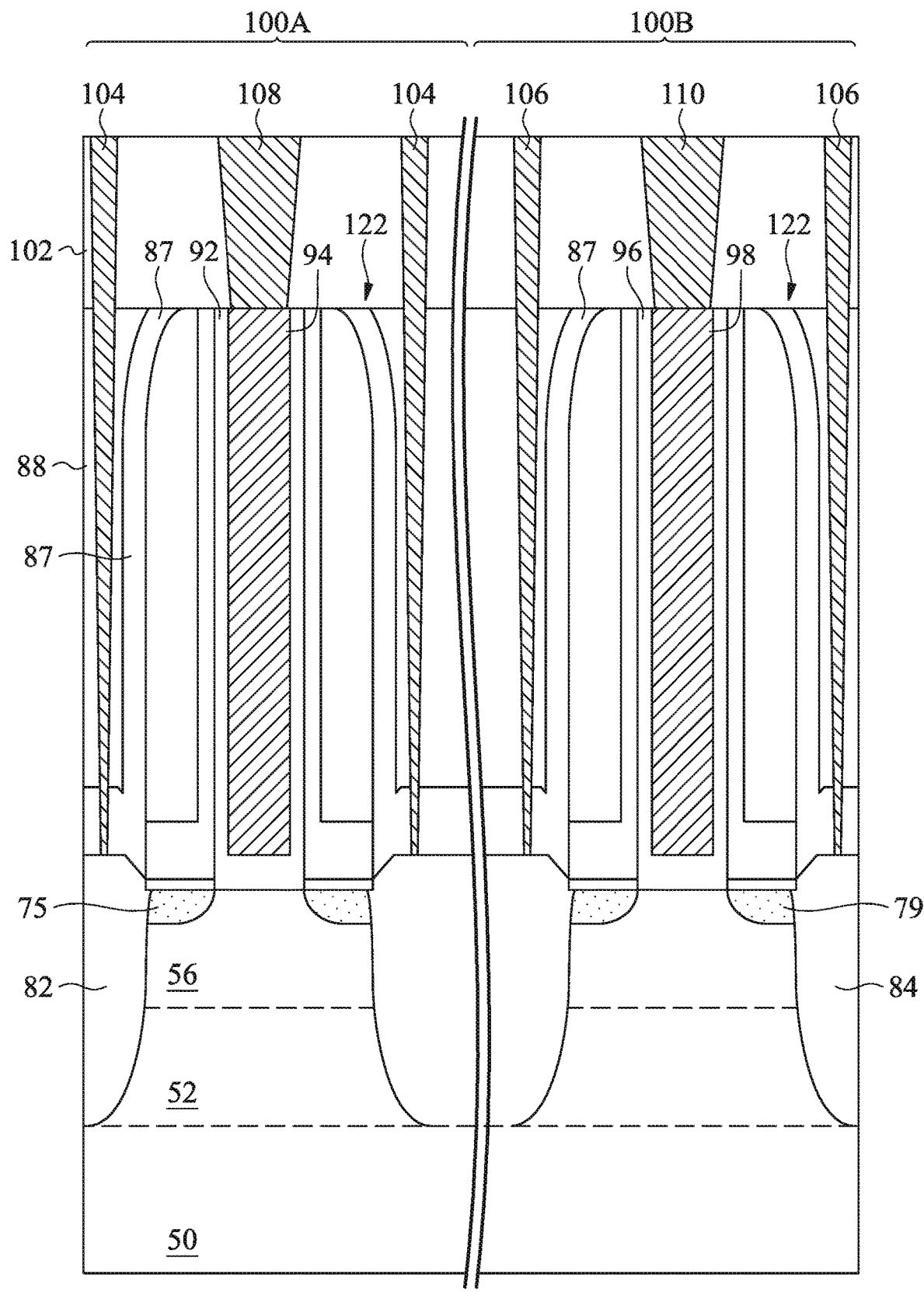
Figure 16C:
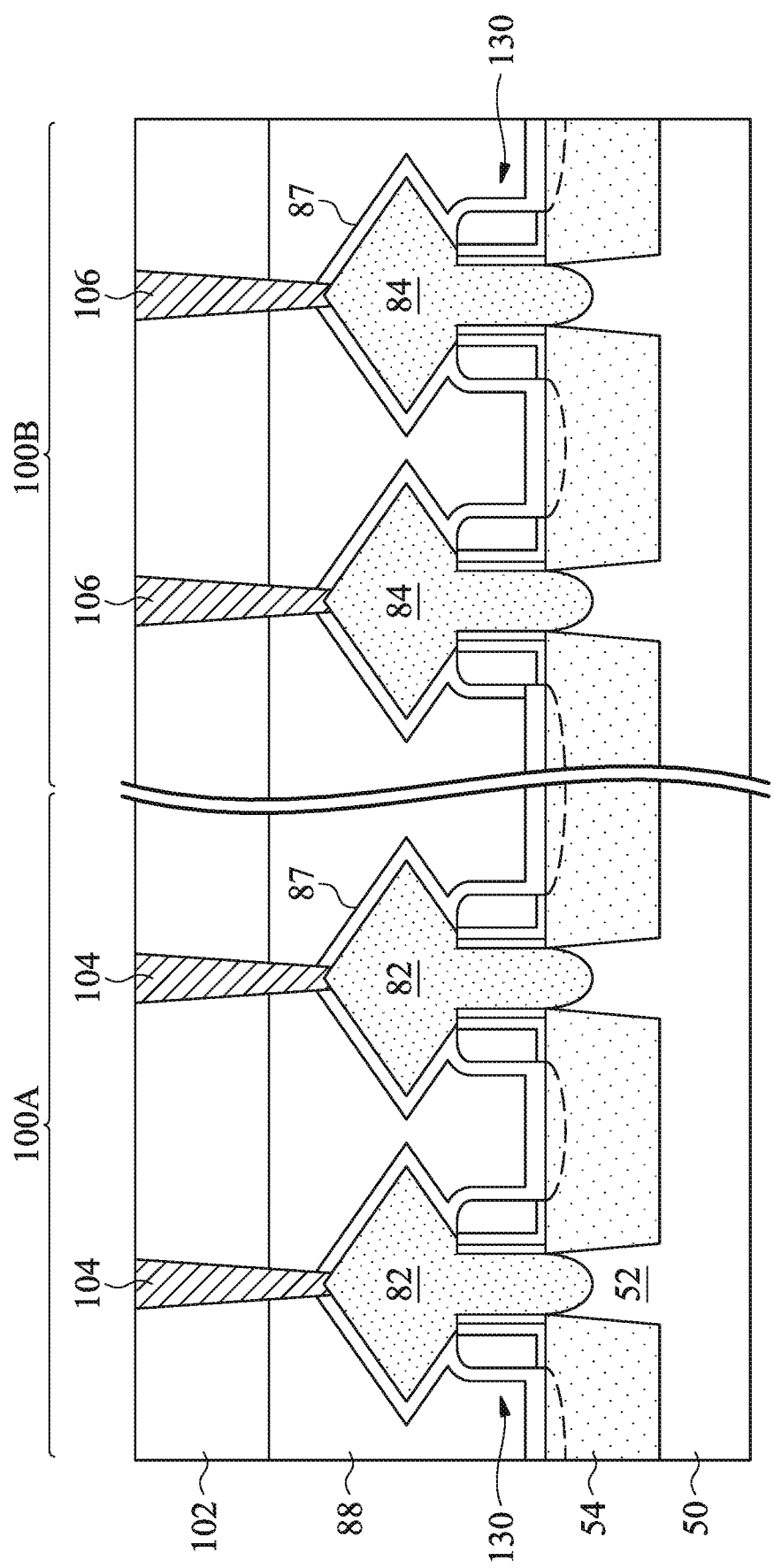

Referring to FIGS. 16A, 16B, and 16C, an ILD 102 is deposited over the ILD 88, contacts 104 and 106 are formed through the ILD 102 and the ILD 88, and contacts 108 and 110 are formed through the ILD 102. In an embodiment, the ILD 102 is formed using similar materials and methods as ILD 88, described above with reference to FIGS. 12A, 12B, and 12C, and the description is not repeated herein for the sake of brevity. In some embodiments, the ILD 102 and the ILD 88 are formed of a same material. In other embodiments, the ILD 102 and the ILD 88 are formed of different materials.

Openings for the contacts 104 and 106 are formed through the ILDs 88 and 102, and the etch stop layer 87. Openings for the contacts 108 and 110 are formed through the ILD 102 and the etch stop layer 87. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess materials from a top surface of the ILD 102. The remaining liner and conductive material form contacts 104, 106, 108, and 110 in the openings. An anneal process may be performed to form a silicide (not shown) at the interface between the epitaxial source/drain regions 82 and 84 and the contacts 104 and 105, respectively. The contacts 104 are physically and electrically coupled to the epitaxial source/drain regions 82, the contacts 106 are physically and electrically coupled to the epitaxial source/drain regions 84, the contact 108 is physically and electrically coupled to the gate electrode 94, and the contact 110 is physically and electrically coupled to the gate electrode 98. While the contacts 104 and 106 are depicted in FIG. 16B in a same cross-section as the contacts 108 and 110, this depiction is for purposes of illustration and in some embodiments the contacts 104 and 106 are disposed in different cross-sections from contacts 108 and 110.

FIGS. 17A, 17B, and 17C illustrated cross-sectional views of a FinFET device that is similar to the FinFET device illustrated in FIGS. 16A, 16B, and 16C, with like elements labeled with like numerical references. In some embodiments, the FinFET device of FIGS. 17A, 17B, and 17C may be formed using similar materials and methods and FinFET device of FIGS. 16A, 16B, and 16C, described above with reference to FIGS. 1-16C, and the description is not repeated herein for the sake of brevity. In the illustrated embodiment, two adjacent source/drain regions 82 and two adjacent source/drain regions 84 are merged to form respective common source/drain regions. In other embodiments, more than two adjacent source/drain regions 82 and more than two adjacent source/drain regions 84 may be merged.

Figure 18:
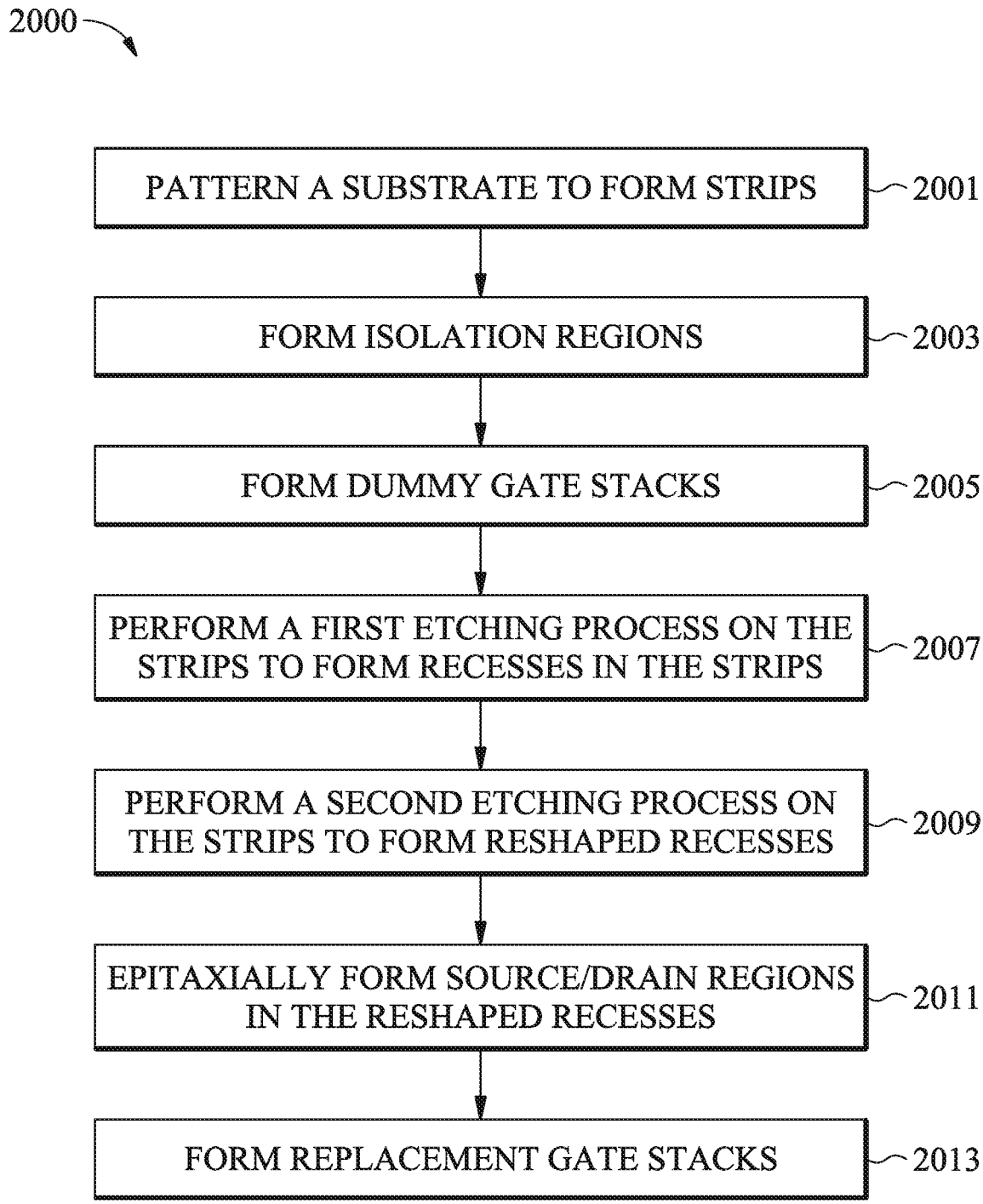
FIG. 18 is a flow diagram illustrating a method of forming a FinFET device in accordance with some embodiments.

FIG. 18 is a flow diagram illustrating a method of forming a FinFET device in accordance with some embodiments. The method 2000 starts with step 2001, where a substrate (such as the substrate 50 illustrated in FIG. 2A) is patterned to form strips (such as the semiconductor strips 52 illustrated in FIG. 3A) as described above with reference to FIGS. 2A and 3A. In step 2003, isolation regions (such as the isolation regions 54 illustrated in FIG. 5A) are formed between adjacent strips as described above with reference to FIGS. 4A and 5A. In step 2005, dummy gate stacks (such as the dummy gate stacks 70 illustrated in FIGS. 7A and 7B) are formed over the strips as described above with reference to FIGS. 6A, 6B, and 7A-7C. In step 2007, a first etching process is performed on the strips to form recesses (such as the recesses 126 illustrated in FIGS. 10A-10F) in the strips as described above with reference to FIGS. 8A-11A. In step 2009, a second etching process is performed on the strips to form reshaped recesses (such as the recesses 126 illustrated in FIG. 10F) in the strips as described above with reference to FIGS. 10C-10F. In step 2011, source/drain regions (such as the epitaxial source/drain regions 82 illustrated in FIGS. 12B and 12C) are epitaxially grown in the reshaped recesses as described above with reference to FIGS. 11A-11C. In some embodiments, steps 2007, 2009, and 2011 are performed on strips disposed in a first region of the substrate where n-type devices are formed. In such embodiments, steps 2007, 2009, and 2011 may be repeated to be performed on strips disposed in a second region of the substrate where p-type devices are formed as described above with reference to FIGS. 12A-12C. In step 2013, replacement gate stacks (such as the gate dielectric layers 92/the gate electrodes 94 and the gate dielectric layers 96/the gate electrodes 98 illustrated in FIGS. 15A and 15B) are formed over the strips as described above with reference to FIGS. 13A-15C.

Various embodiments discussed herein allow for improved FinFET performance. For example, the additional etching described above with reference to FIGS. 10A-10F can shape a channel region beneath the gate stack such that the top of the channel region has a smaller lateral dimension (i.e., decreasing the surface proximity). By reducing the size of the top of the channel region, current flowing through the channel is confined to a smaller volume beneath the gate stack, which can increase current density during operation and improve device efficiency. For example, shaping the channel region as described can increase $I_{ON}$ and decrease $I_{OFF}$. In some cases, reducing the surface proximity as described herein can allow a strained source/drain epitaxy formed in the recess to generate greater strain near the top of the channel region, and consequently mobility near the top of the channel region can be increased due to the strain. In some cases, increasing the depth of the recess (i.e., increasing the trench depth) next to a channel region can decrease control of the short-channel effect of the FinFET, and increasing the diameter of the etch near the middle of the recess (i.e., decreasing the tip proximity) can increase degradation due to drain-induced barrier leakage (DIBL). The additional etching of the recess as described herein can decrease the surface proximity with little or no increase of the tip proximity and with little or no increase of the trench depth. In some cases, the embodiments described herein can reduce the amount of residue (e.g., C, O, N, Cl, F, or other substances) remaining on etched surfaces.

According to an embodiment, a method includes forming a fin over a substrate, forming an isolation region adjacent the fin, forming a dummy gate structure over the fin, recessing the fin adjacent the dummy gate structure to form a first recess using a first etching process, reshaping the first recess to form a reshaped first recess using a second etching process, wherein the second etching process etches upper portions of the fin adjacent the top of the recess more than the second etching process etches lower portions of the fin adjacent the bottom of the recess, and epitaxially growing a source/drain region in the reshaped first recess. Reshaping the first recess includes performing an oxide etch process, wherein the oxide etch process forms a porous material layer within the recess. The porous material layer includes ammonium fluorosilicate (AFS). The oxide etch process includes a plasma etch. Reshaping the first recess includes removing portions of the porous material layer, wherein a greater amount of the porous material layer adjacent the bottom of the recess is removed than the amount of porous material layer adjacent the top of the recess while removing portions of the porous material layer. The second etching process is performed in the same chamber as the oxide etching process. The reshaped first recess is widest at the top of the reshaped first recess. The second etching process includes etching using radicals. Epitaxially growing the source/drain region in the reshaped first recess includes epitaxially growing a first semiconductor material in the reshaped first recess, the first semiconductor material being different from a second semiconductor material of the fin.

According to another embodiment, a method includes patterning a substrate to form a strip, the strip including a first semiconductor material, forming an isolation region along a sidewall of the strip, an upper portion of the strip extending above a top surface of the isolation region, forming a dummy gate structure along sidewalls and a top surface of the upper portion of the strip, a first etching process on an exposed portion of the upper portion of the strip to form a first recess, the exposed portion of the strip being exposed by the dummy gate structure, forming a porous material covering portions of the first semiconductor material of the sidewalls of the first recess, etching the first semiconductor material of the sidewalls of the first recess, wherein first portions of the first semiconductor material of the sidewalls of the first recess that are covered by more porous material are etched more than second portions of the first semiconductor material of the sidewalls of the first recess that are covered by less porous material, thereby reshaping the first recess, and epitaxially growing a source/drain region in the reshaped first recess. The first portions of the first semiconductor material of the sidewalls of the first recess are closer to the top of the first recess than the second portions of the first semiconductor material of the sidewalls of the first recess. The porous material includes ammonium fluorosilicate (AFS). The method includes removing the porous material. Etching the first semiconductor material of the sidewalls of the first recess includes chemically etching the first semiconductor material using radicals. Etching the first semiconductor material of the sidewalls of the first recess includes chemically etching the first semiconductor material using ammonium hydroxide ($NH_4OH$). The method includes removing an oxide from the sidewalls of the first recess using an oxide etch process that is different than the first etching process.

According to another embodiment, a device includes a fin over a substrate, wherein the fin is narrower at a top surface of the fin than below the top surface of the fin, wherein the fin has a first sidewall slope at the top of the fin and a second sidewall slope at the bottom of the fin, and wherein the fin has a third sidewall slope between the first sidewall slope and the second sidewall slope that is greater than the first sidewall slope and that is greater than the second sidewall slope, an isolation region adjacent the fin, a gate structure along sidewalls of the fin and over the top surface of the fin, a gate spacer laterally adjacent the gate structure, and an epitaxial region adjacent the fin, wherein a first portion of the epitaxial region adjacent the top surface of the fin protrudes beneath the gate spacer a greater lateral distance than a second portion of the epitaxial region below the top surface of the fin. The first portion of the epitaxial region has straight sidewalls. The epitaxial region is wider at the top surface of the fin than below the top surface of the fin. The fin includes a first semiconductor material and the epitaxial region includes a second semiconductor material, the second semiconductor material being different from the first semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a fin over a substrate, wherein the fin is narrower at a top surface of the fin than below the top surface of the fin, wherein the fin has a first sidewall slope at the top of the fin and a second sidewall slope at the bottom of the fin, and wherein the fin has a third sidewall slope between the first sidewall slope and the second sidewall slope that is greater than the first sidewall slope and that is greater than the second sidewall slope;
   an isolation region adjacent the fin;
   a gate structure along sidewalls of the fin and over the top surface of the fin;
   a gate spacer laterally adjacent the gate structure; and
   an epitaxial region adjacent the fin, wherein a first portion of the epitaxial region adjacent the top surface of the fin protrudes beneath the gate spacer a greater lateral distance than a second portion of the epitaxial region below the top surface of the fin.

2. The device of claim 1, wherein the first portion of the epitaxial region has straight sidewalls.

3. The device of claim 1, wherein the epitaxial region is wider at the top surface of the fin than below the top surface of the fin.

4. The device of claim 1, wherein the fin comprises a first semiconductor material and the epitaxial region comprises a second semiconductor material, the second semiconductor material being different from the first semiconductor material.

5. The device of claim 1, wherein the third sidewall slope is a vertical slope.

6. The device of claim 1, further comprising a dielectric layer between the top surface of the fin and the gate spacer, wherein the epitaxial region physically contacts an underside surface of the dielectric layer.

7. A semiconductor device comprising:
   a fin protruding from a semiconductor, the fin extending in a first direction;
   a first gate structure extending in a second direction over a top surface of the fin and along sidewalls of the fin;
   a first gate spacer along a sidewall of the first gate structure;
   a second gate structure extending in the second direction over the top surface of the fin and along sidewalls of the fin, wherein the second gate structure is separated from the first gate structure by a first distance measured in the first direction;
   a second gate spacer along a sidewall of the second gate structure, wherein the first gate spacer is separated from the second gate spacer by a second distance measured in the first direction;
   a recess in the fin between the first gate structure and the second gate structure, wherein the recess has a largest width measured in the first direction, wherein the recess has a first width at the top surface of the fin and measured in the first direction, wherein the first width is greater than the second distance, and wherein the first width is the same as the largest width; and
   an epitaxial source/drain region in the recess.

8. The semiconductor device of claim 7, wherein the first gate spacer and the second gate spacer protrude over the recess at the top surface of the fin.

9. The semiconductor device of claim 8, wherein the first gate spacer protrudes over the recess a lateral distance in the range from 0.5 nm to 1.5 nm.

10. The semiconductor device of claim 7, wherein the sidewalls of the recess at half the full depth of the recess have a greater slope than the sidewalls of the recess at the top surface of the fin.

11. The semiconductor device of claim 7, wherein the sidewalls of the recess at half the full depth of the recess have a greater slope than the sidewalls of the recess between half the full depth of the recess to the full depth of the recess.

12. The semiconductor device of claim 7, wherein the sidewalls of the recess at half the full depth of the recess are vertical.

13. The semiconductor device of claim 7, wherein the width of the recess at half the full depth of the recess and measured in the first direction is less than the largest width.

14. The semiconductor device of claim 7, wherein the sidewalls of the recess at the top surface of the fin are vertical.

15. The semiconductor device of claim 7, wherein the narrowest portion of the fin measured in the first direction comprises the top surface of the fin.

16. A device comprising:
   a strip over a semiconductor substrate, the strip comprising a first semiconductor material;
   an isolation region surrounding the strip;
   a gate structure extending over a top surface of the strip and along sidewalls of the strip;
   a gate spacer along a sidewall of the gate structure; and
   a source/drain region in the strip, wherein the source/drain region extends along an underside of the gate spacer, wherein a width of the source/drain region decreases monotonically from a first vertical location at the top surface of the strip to a second vertical position at the bottom of the source/drain region, wherein a middle portion of the sidewall of the source/drain region is between a lower portion of the sidewall and an upper portion of the sidewall, wherein the slope of the middle portion is greater than the slope of the lower portion and is greater than the slope of the upper portion.

17. The device of claim 16, wherein the source/drain region protrudes above the top surface of the strip.

18. The device of claim 16, wherein the source/drain region has a U-shaped bottom.

19. The device of claim 16, wherein the vertical distance from the first vertical position to the second vertical position is in the range between 40 nm and 70 nm.

20. The device of claim 16, wherein the source/drain region extends under the gate spacer a lateral distance in the range from 0.5 nm to 1.5 nm.

* * * * *